US010965245B2

United States Patent
Han et al.

(10) Patent No.: US 10,965,245 B2
(45) Date of Patent: Mar. 30, 2021

(54) PHOTOVOLTAIC MODULE, PHOTOVOLTAIC SYSTEM AND METHOD OF OPERATING PHOTOVOLTAIC SYSTEM

(71) Applicant: LG ELECTRONICS INC., Seoul (KR)

(72) Inventors: Dongho Han, Seoul (KR); Hyunho Do, Seoul (KR); Juhwan Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 235 days.

(21) Appl. No.: 16/159,204

(22) Filed: Oct. 12, 2018

(65) Prior Publication Data

US 2019/0115868 A1    Apr. 18, 2019

(30) Foreign Application Priority Data

Oct. 12, 2017  (KR) .................. 10-2017-0132095

(51) Int. Cl.
*H02S 40/32*     (2014.01)
*H02J 3/38*      (2006.01)
(Continued)

(52) U.S. Cl.
CPC ........ *H02S 40/32* (2014.12); *H01L 31/02021* (2013.01); *H02J 3/383* (2013.01);
(Continued)

(58) Field of Classification Search
CPC .......... H02S 40/32; H02S 40/34; H02J 3/381; H02J 2300/24; H02J 13/00007; H02J 7/35;
(Continued)

(56) References Cited

U.S. PATENT DOCUMENTS 8,780,592 B1 * 7/2014 Jones ................. H02M 1/12
                                                      363/39
9,871,380 B1 * 1/2018 Cheng ................ H02M 7/04
(Continued)

FOREIGN PATENT DOCUMENTS

EP       2899867 A2    7/2015

OTHER PUBLICATIONS

Wikipedia contributors. "Gateway (telecommunications)." Wikipedia, The Free Encyclopedia. Wikipedia, The Free Encyclopedia, Dec. 1, 2020. Web. Dec. 2, 2020. (Year: 2020).*

*Primary Examiner* — Daniel J Cavallari
(74) *Attorney, Agent, or Firm* — Birch, Stewart, Kolasch & Birch, LLP

(57) ABSTRACT

According to an embodiment of the present invention, there is provided a photovoltaic module including a photovoltaic solar cell, a converter to convert a level of a direct current power from the photovoltaic solar cell, an inverter to convert the direct current power from the converter into an alternating current power, a controller to control the converter and the inverter, and a communication unit to perform electric power line communication with a gateway and at least one nearby photovoltaic module, in which the communication unit periodically transmits communication state information to the gateway and the at least one nearby photovoltaic module using the electric power line communication, and receives a message transmitted by the gateway along a path determined according to the communication state information.

13 Claims, 19 Drawing Sheets

(51) Int. Cl.
  *H02S 40/34* (2014.01)
  *H04B 3/54* (2006.01)
  *H02J 13/00* (2006.01)
  *H01L 31/02* (2006.01)
  *H02J 7/35* (2006.01)

(52) U.S. Cl.
  CPC .......... *H02J 7/35* (2013.01); *H02J 13/00007* (2020.01); *H02S 40/34* (2014.12); *H04B 3/548* (2013.01); *H04B 2203/547* (2013.01)

(58) Field of Classification Search
  CPC ... H02J 3/383; H04B 3/548; H04B 2203/547; H01L 31/02021; Y04S 10/123; Y04S 40/121; Y02E 10/56; Y02E 40/70
  See application file for complete search history.

(56) References Cited

U.S. PATENT DOCUMENTS

| | | |
|---|---|---|
| 2016/0020612 A1 | 1/2016 | Rotzoll et al. |
| 2017/0271973 A1 | 9/2017 | Jones et al. |

* cited by examiner

PHOTOVOLTAIC MODULE, PHOTOVOLTAIC SYSTEM AND METHOD OF OPERATING PHOTOVOLTAIC SYSTEM

CROSS-REFERENCE TO RELATED APPLICATION

This application claims the priority benefit of Korean Patent Application No. 10-2017-0132095, filed on Oct. 12, 2017 in the Korean Intellectual Property Office, the disclosure of which is incorporated herein by reference in its entirety.

BACKGROUND OF THE INVENTION

1. Field of the Invention

The present invention relates to a photovoltaic module, a photovoltaic system, and a method of operating the photovoltaic system, and more particularly to a photovoltaic module, a photovoltaic system, and a method of operating the photovoltaic system that are capable of optimally receiving or transmitting a message according to an electric power line communication environment.

2. Description of the Related Art

Increased energy consumption caused concern over expected rapid depletion of existing energy sources, such as petroleum and coal. Thus, alternative energy sources, as alternatives to the existing energy sources, have been getting a lot of attention in recent years. Among the alternative energy sources, a photovoltaic solar cell is highlighted as a next-generation battery that converts solar energy directly into a flow of electrons using a semiconductor element.

A photovoltaic module is obtained by connecting photovoltaic solar cells in series or in parallel for generating electric power using sunlight. The photovoltaic module comprises a junction box that collects electricity which is generated by the photovoltaic solar cells.

In a case where a communication unit is provided within the junction box, the communication transmits and receives data to and from a gateway.

In the case of a system in which a plurality of photovoltaic modules are arranged, there is a need to exchange data between each photovoltaic module and the gateway. However, in a case where a communication environment is temporarily unstable, there is a disadvantage in that direct data communication between each photovoltaic module and the gateway is impossible.

SUMMARY OF THE INVENTION

It is an object of the present invention is to provide a photovoltaic module, a photovoltaic system, and a method of operating the photovoltaic system that are capable of optimally receiving or transmitting a message according to an electric power line communication environment.

In accordance with an aspect of the present invention, the above and other objects can be accomplished by the provision of a photovoltaic module including a photovoltaic solar cell, a converter to convert a level of a direct current power from the photovoltaic solar cell, an inverter to convert the direct current power from the converter into an alternating current power, a controller to control the converter and the inverter, and a communication unit to perform electric power line communication with a gateway and at least one nearby photovoltaic module, in which the communication unit periodically transmits communication state information to the gateway and the at least one nearby photovoltaic module using the electric power line communication, and receives a message transmitted by the gateway along a path determined according to the communication state information.

In accordance with another aspect of the present invention, there is provided a photovoltaic system including: a plurality of photovoltaic modules, and a gateway to perform electric power line communication with the plurality of photovoltaic modules, in which the gateway receives communication state information from the plurality of photovoltaic modules, generates a routing tree for the plurality of photovoltaic modules based on the communication state information, and transmits a message to a second photovoltaic module adjacent to a first photovoltaic module, based on information of the generated routing tree for transmitting the message to the first photovoltaic module among the plurality of photovoltaic modules.

In accordance with another aspect of the present invention, there is provided a method of operating a photovoltaic system that includes a plurality of photovoltaic modules and a gateway to perform electric power line communication with the plurality of photovoltaic modules, the method including: receiving communication state information from the plurality of photovoltaic modules, generating a communication path that determines a first photovoltaic module group that possibly transmits a message directly to the gateway and a second photovoltaic module group that possibly transmits a message via at least one photovoltaic module in the first photovoltaic module group, based on the communication state information from the plurality of photovoltaic modules, and transmitting a message along the communication path generated in advance, when transmitting the message to one among the plurality of photovoltaic modules.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

The present invention will be described in more detail below with reference to the drawings.

The terms "module" and "unit" that will be used in the following description to name a constituent element are assigned only for ease of description in the present specification, and are not in themselves intended particularly to attach an important meaning or to provide important functionality. Therefore, the terms "module" and "unit" may be used interchangeably.

Figure 1:
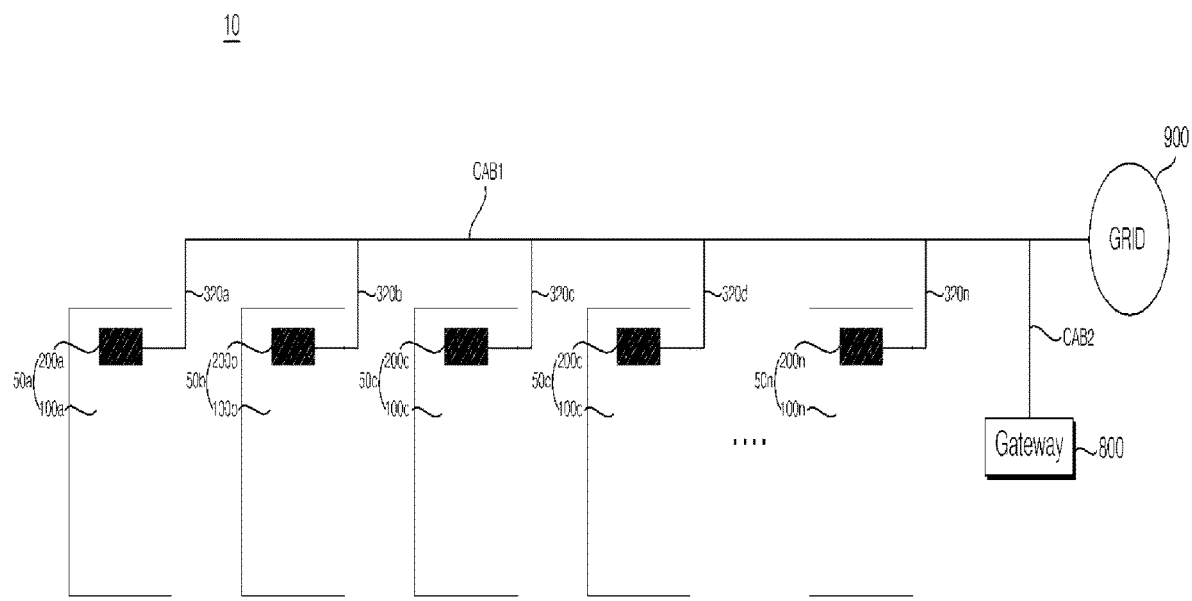
FIG. 1 is an example of a diagram of a configuration of a photovoltaic system according to an embodiment of the present invention.

FIG. 1 is an example of a diagram of a configuration of a photovoltaic system according to an embodiment of the present invention. All the components of the photovoltaic system according to all embodiments of the present invention are operatively coupled and configured.

With reference to the drawings, a photovoltaic system in FIG. 1 comprises a plurality of photovoltaic modules (50a, 50b, and so forth up to 50n), a gateway 800 that performs communication with the plurality of modules 50a, 50b, and so forth up to 50n), and a grid 900 to which alternating current powers of the plurality of photovoltaic modules 50a, 50b, and so forth up to 50n are output.

The plurality of photovoltaic modules 50a, 50b, and so forth up to 50n have alternating current output cables 320a, 320b, and so forth up to 320n, respectively. The photovoltaic system 10 in FIG. 1 further comprises a shared cable CAB1 connected in a shared manner to each of the alternating current output cables 320a, 320b, and so forth up to 320n, and a connection cable CAB2 that connects between the shared cable CAB1 and the gateway 800.

The photovoltaic modules 50a, 50b, and so forth up to 50n have photovoltaic solar cell modules 100a, 100b, and so forth up to 100n, respectively, and junction boxes 200a, 200b, and so forth up to 200n, respectively. Each of the photovoltaic solar cell modules 100a, 100b, and so forth up to 100n comprises a plurality of photovoltaic solar cells and generates a direct current power. The junction boxes 200a, 200b, and so forth up to 200n are attached to the rear surfaces, respectively, of the photovoltaic solar cell modules 100a, 100b, and so forth up to 100n, and convert direct current powers from the photovoltaic solar cell modules 100a, 100b, and so forth up to 100n, into alternating current powers, respectively, and output the resulting alternating current powers.

The junction boxes 200a, 200b, and so forth up to 200n here comprise electric power conversion modules 700 (FIG. 2), respectively, that convert the direct current powers from the photovoltaic solar cell modules 100a, 100b, and so forth up to 100n into alternating current powers, respectively, and output the resulting alternating current powers.

On one circuit substrate, the electric power conversion module 700 (FIG. 2) comprises a bypass diode unit 510 that comprises bypass diodes Da, Db, and Dc, a capacitor unit 520 (FIG. 2) in which a direct current power from the bypass diode unit 510 is stored, a converter 530 (FIG. 2) that converts a level of a direct current power, an inverter 540 (FIG. 2) that converts a direct current power into an alternating current power, a controller 550 that controls the converter and the inverter, and a communication unit 570 (FIG. 2) that communicates with the gateway 800. The electric power conversion module 700 (FIG. 2) is also referred to as a micro-inverter.

On the other hand, the plurality of photovoltaic modules 50a, 50b, and so forth up to 50n in the embodiment of the present invention directly output alternating current powers through the photovoltaic solar cell modules 100a, 100b, and so forth up to 100n, respectively, and the junction boxes 200a, 200b, and so forth up to 200n, respectively, and therefore is also referred to photovoltaic AC modules.

On the other hand, in this configuration, the micro-inverters, each of which outputs an alternating current power, are attached on the photovoltaic solar cell modules 100a, 100b, and so forth up to 100n, respectively. Thus, although an output from any one of the photovoltaic solar cell modules falls, parallel connections among the plurality of photovoltaic modules 50a, 50b, and so forth up to 50n make it possible to supply generated alternating current powers to the grid 900.

In addition, unlike in a string technique in which the plurality of photovoltaic modules 50a, 50b, and so forth up to 50n are in series connected to each other, alternating current powers are generated and are output independently of each other. Furthermore, the parallel connections make it possible for the photovoltaic modules to stably output their respective alternating current powers to a grid without depending on each other to output the alternating current power.

Figure 2:
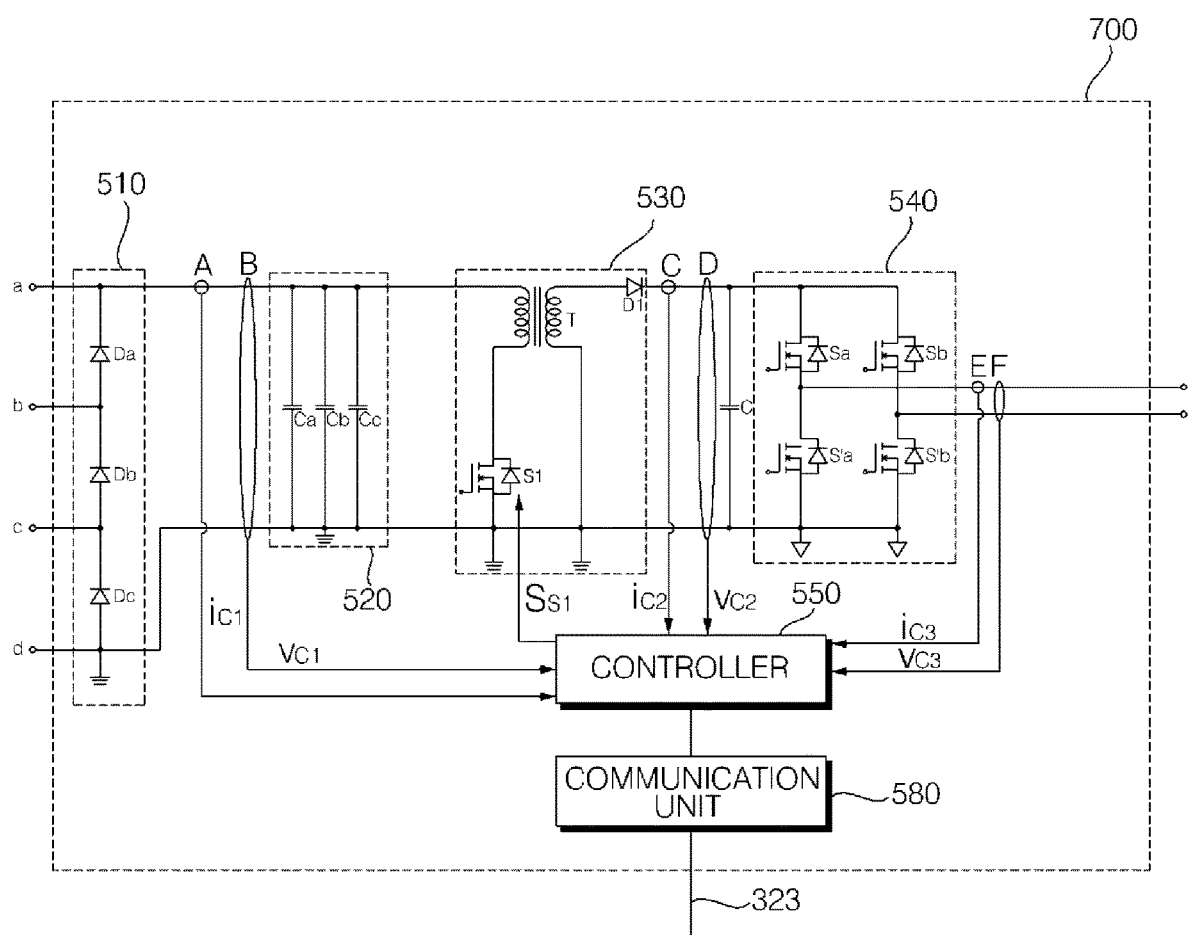
FIG. 2 is an example of a block diagram of an electric power conversion module within a junction box in FIG. 1.

On the other hand, in the embodiment of the present invention, the photovoltaic modules 50a, 50b, and so forth up to 50n output their respective pieces of photovoltaic electric power information and the like, which are generated in the photovoltaic modules 50a, 50b, and so forth up to 50n themselves, to the gateway 800 through the communication unit 570 (FIG. 2).

Through electric power line communication (PLC), the communication unit 570 (FIG. 2) at this time outputs an alternating current power comprising information, which results from adding a carrier frequency signal comprising predetermined information to the alternating current power that results from the conversion in the inverter 530 (FIG. 2), to the grid.

Through the electric power line communication (PLC), the gateway 800 receives information from each of the plurality of photovoltaic modules 50a, 50b, and so forth up to 50n. That is, the information is received from each of the plurality of photovoltaic modules 50a, 50b, and so forth up to 50n through the gird and signal processing is performed on the received information.

Figure 3:
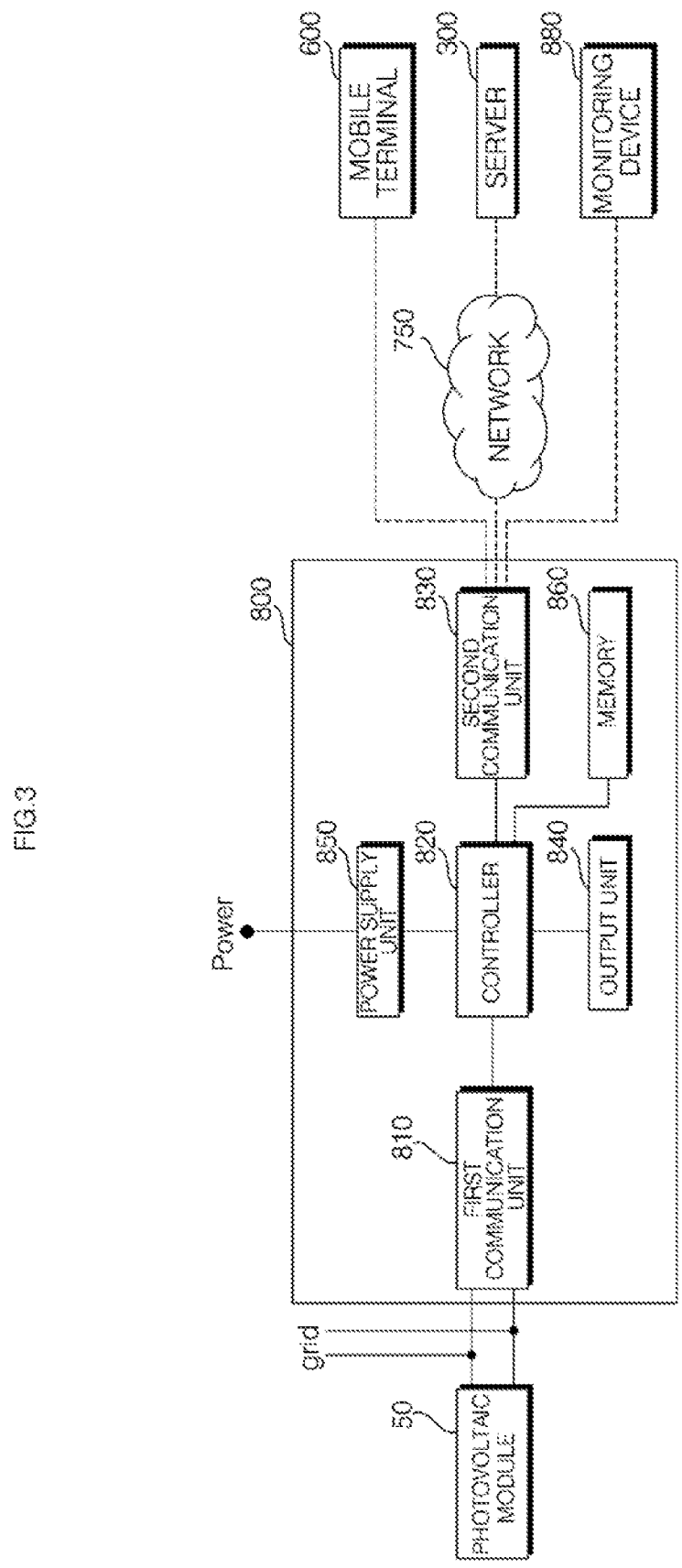
FIG. 3 is an example of a block diagram of the inside of a gateway in FIG. 1.

To do this, the gateway 800 comprises a first communication unit 810 (FIG. 3), a controller 820 (FIG. 3), a second communication unit 830 (FIG. 3), an output unit 840 (FIG. 3), a power supply unit 850 (FIG. 3), and a memory 860 (FIG. 3).

The first communication unit 810 receives the photovoltaic electric power information, electric current information, voltage information, and the like from the plurality of photovoltaic modules 50a, 50b, and so forth up to 50n using the electric power line communication, and transmits the received pieces of information to the controller 820.

The first communication unit 810 (FIG. 3) separates the carrier frequency signal from the received alternating current power, and extracts the information from the carrier frequency signal. The extracted information is transmitted to the controller 820 (FIG. 3).

The controller 820 (FIG. 3) signal-processes the photovoltaic electric power information received in the first communication unit 810 (FIG. 3), electric current information and voltage information of the electric power conversion module connected to the photovoltaic solar cell module, and state information of the grid. Control is performed in such a manner that the signal-processed information and the like are stored in the memory 860.

Stored in the memory 860 (FIG. 3) are the photovoltaic electric power information received through the first communication unit 810 (FIG. 3), the electric current information and the voltage information of the electric power conversion module connected to the photovoltaic solar cell module, and the state information of the grid.

Stored in the memory 860 (FIG. 3) are particularly the photovoltaic electric power information received in real time, the electric current information and the voltage information of the electric power conversion module, which are received in real time, and the state information of the gird, which is received in real time.

The controller 820 (FIG. 3) generates monitoring information possibly monitored, using the photovoltaic electric power information, the electric current information and the voltage information of the electric power conversion module, and the like, which, for a predetermined time, are accumulated and are stored.

The monitoring information at this time comprises at least one among the photovoltaic electric power information, electric current information and voltage information of an input into and an output from the electric power conversion unit connected to the photovoltaic solar cell module, and the state information of the grid.

The controller 820 (FIG. 3) performs control in such a manner that the monitoring information is stored in the memory 860 (FIG. 3), or performs control in such a manner that the information is displayed or is output as audio through the output unit 840 (FIG. 3).

On the other hand, the controller 820 (FIG. 3) performs the control in such a manner that the monitoring information is transmitted to another apparatus, which is present in the outside world, through the second communication unit 830 (FIG. 3). For example, the monitoring information is transmitted to a nearby mobile terminal 600, or is transmitted to a server 300 or a mobile terminal 600 through a network 750.

On the other hand, the power supply unit 850 can be supplied with a separate power from the outside. Thus, even in a case where an alternating current power does not flow through the grid, the information is possibly received from each of the plurality of photovoltaic modules 50*a*, 50*b*, and so forth up to 50*n*. In addition, even in a case where an alternating current power does not flow through the grid and where an alternating current power is not output from each of the plurality of photovoltaic modules 50*a*, 50*b*, and so forth up to 50*n*, the information is received using a direct current power. Therefore, the stable information reception is possible.

On the other hand, the photovoltaic system 10 according to the embodiment of the present invention comprises a plurality of photovoltaic modules 50 and the gateway 800 that performs the electric power line communication with the plurality of photovoltaic modules 50*a*, 50*b*, and so forth up to 50*n*. The gateway 800 receives communication state information from the plurality of photovoltaic modules, and based on the communication state information, generates a routing tree for the plurality of photovoltaic modules 50*a*, 50*b*, and so forth up to 50*n*. When among the plurality of photovoltaic modules 50*a*, 50*b*, and so forth up to 50*n*, a message is transmitted to a first photovoltaic module based on information of the generated routing tree, the message is transmitted to a second photovoltaic module adjacent to the first photovoltaic module. Thus, optimal message reception or transmission can be possible according to an electric power line communication environment.

Particularly, the gateway 800 receives communication state information that comprises self-identification information of the photovoltaic module, and reception sensitivity information of a self-identification signal of at least one nearby photovoltaic module, from each of the photovoltaic modules 50*a*, 50*b*, and so forth up to 50*n*, and based on the communication state information, generates the routing tree. Thus, the optimal message reception or transmission can be possible according to a current electric power line communication environment.

On the other hand, the self-identification signal can be a beacon signal transmitted periodically. The beacon comprises ID information or the like.

The gateway 800 periodically updates the routing tree, and thus always-optimal message reception or transmission is possible.

For example, in a case where the electric power line communication between the gateway 800 and the first photovoltaic module is temporarily impossible, direct communication between the gateway 800 and the first photovoltaic module is not performed, and instead, message transmission between the second photovoltaic module and the gateway 800 and message transmission between the second photovoltaic module and the first photovoltaic module are be performed in a manner that takes a detour. Thus, stable message transmission is possible.

Particularly, without an attempt being made for message transmission between the gateway 800 and the first photovoltaic module, the optimal message reception or transmission can be possible according to the electric power line communication environment based on information of the routing tree generated in the gateway 800.

On the other hand, based on the routing tree generated in the gateway 800, the plurality of photovoltaic modules 50*a*, 50*b*, and so forth up to 50*n* are categorized into branch photovoltaic modules that possibly perform direct data communication between the gateway and leaf photovoltaic modules that perform data communication with the branch photovoltaic modules, instead of the direct data communication with the gateway.

On the other hand, among the plurality of photovoltaic modules 50*a*, 50*b*, and so forth up to 50*n*, the branch photovoltaic module comprises a photovoltaic solar cell module 100, a converter 530 that converts a level of a direct current power which is input from the photovoltaic solar cell module 100 and outputs a result of the conversion, an inverter 540 that converts a direct current power from the converter 530 into an alternating current power, a controller 550 that controls the converter 530 and the inverter 540, and a communication unit 580 that performs the electric power line communication between the gateway 800 and at least one nearby photovoltaic module 50.

At this time, the communication unit 580 within the branch photovoltaic module transmits a self-identification signal to the gateway 800, receives a self-identification signal of at least one nearby photovoltaic module 50, and transmits communication state information comprising reception sensitivity information of the self-identification signal of the at least one nearby photovoltaic module 50 to the gateway 800. In a case where the communication unit 580 receives a message, the communication unit 580 transmits the message to the first photovoltaic module of at least one nearby photovoltaic module 50 via a connection 323, for example. Thus, the optimal message reception or transmission can be possible according to the electric power line communication environment.

For example, in the case where the electric power line communication between the gateway 800 and the first photovoltaic module is temporarily impossible, the direct communication between the gateway 800 and the first photovoltaic module is not performed, and instead, message transmission between the photovoltaic module 50 and the gateway 800 and message transmission between the photovoltaic module 50 and the first photovoltaic module are performed in a manner that takes a detour. Thus, the stable message transmission is possible.

Particularly, without an attempt being made for message transmission between the gateway 800 and the first photovoltaic module, the optimal message reception or transmission can be possible according to the electric power line communication environment based on the information of the routing tree generated in the gateway 800. On the other hand, among the plurality of photovoltaic modules 50a, 50b, and so forth up to 50n, the leaf photovoltaic module comprises a photovoltaic solar cell module 100, a converter 530 that converts a level of a direct current power which is input from the photovoltaic solar cell module 100 and outputs a result of the conversion, an inverter 540 that converts a direct current power from the converter 530 into an alternating current power, a controller 550 that controls the converter 530 and the inverter 540, and a communication unit 580 that performs the electric power line communication between the gateway 800 and at least one nearby photovoltaic module 50.

At this time, the communication unit 580 within the leaf photovoltaic module transmits a self-identification signal to the gateway 800, receives a self-identification signal of a nearby photovoltaic module 50, transmits communication state information comprising reception sensitivity information of the self-identification signal of the nearby photovoltaic module 50 to the gateway 800, and receives a message originated from the gateway 800, from the first photovoltaic module of at least one nearby photovoltaic module 50. Thus, the optimal message reception or transmission can be possible according to the electric power line communication environment.

FIG. 2 is an example of a block diagram of the electric power conversion module within the junction box in FIG. 1.

With reference to the drawings, the electric power conversion module 700 within a junction box 200 comprises the bypass diode unit 510, the converter 530, the capacitor C1, the inverter 540, the controller 550, and the communication unit 580.

The bypass diode unit 510 comprises bypass diodes Dc, Db, and Da that are arranged between each of the first to fourth conductive lines 135a, 135b, 135c, and 135d, respectively, of the photovoltaic solar cell module 100. At this time, the number of bypass diodes is 1 or greater, and is preferably smaller by 1 than the number of conductive lines.

The bypass diodes Dc, Db, and Da receive photovoltaic direct current powers, as inputs, particularly from the first to fourth conductive lines 135a, 135b, 135c, and 135d) within a photovoltaic solar cell module 50. Then, in a case where a reverse voltage occurs in a direct current power from at least one among the first to fourth conductive lines 135a, 135b, 135c, and 135d), the bypass diodes Dc, Db, and Da bypass the reverse voltage.

On the other hand, an input power Vpn that passes through the bypass diode unit 510 is input into the converter 530.

The converter 530 converts an input power Vpv output from the bypass diode unit 510.

On the other hand, the converter 530 is referred to as a first electric power conversion unit.

Figure 8A:
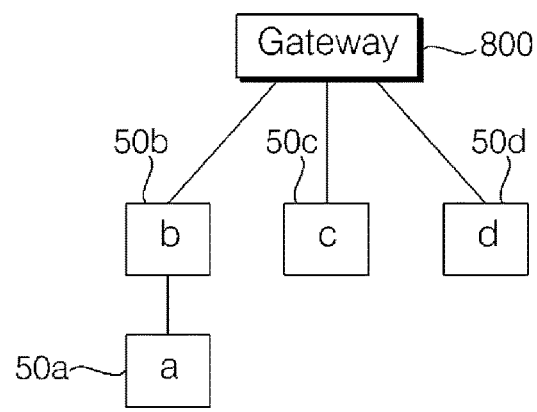

For example, the converter 530, as illustrated in FIG. 8A, converts a direct current input power Vpv into a pseudo direct current power (pseudo dc voltage). Accordingly, the direct current power is stored in the capacitor C1.

On the other hand, both terminals of the dc-terminal capacitor C1 are dc terminals, and the capacitor C1 is also referred to as a dc-terminal capacitor. As another example, the converter 530, as illustrated in FIG. 8A, steps up the direct current input power Vpv and converts the resulting direct current input power Vpv into a direct current power. Accordingly, the direct current power that results from the stepping-up is stored in the dc-terminal capacitor C1.

The inverter 540 converts the direct current power, which is stored in the dc-terminal capacitor C1, into an alternating current power. On the other hand, the inverter 540 is referred to as a second electric power conversion unit.

For example, the inverter 540 converts the pseudo direct current power (the pseudo dc voltage), which results from the conversion in the converter 530, into an alternating current power.

As another example, the inverter 540 converts the direct current power that results from the stepping-up in the converter 530 into an alternating current power.

On the other hand, the converter 530 preferably comprises a plurality of interleaving converters for the conversion of the pseudo direct current power (the pseudo dc voltage) or for the conversion of the direct current power that results from the stepping-up.

Particularly, in the embodiment of the present invention, the converter 530 is assumed to comprise three or more interleaving converters.

In the drawings, it is illustrated that n converters 610a, 610b, and so forth up to 610n are connected in parallel to each other. The n converters 610a, 610b, and so forth up to 610n have the same energy conversion capacity.

An electric current that results from the direct current input power Vpv decreases to 1/N in the n converters 610a, 610b, and so forth up to 610n, and output electric currents of the converters merge into one electric current at output terminals of the n converters 610a, 610b, and so forth up to 610n.

On the other hand, the n converters 610a, 610b, and so forth up to 610n perform an interleaving operation, and when it comes to an electric current phase, each of the n converters 610a, 610b, and so forth up 610n operate with a phase delay of +(360°/N)–(360°/N) or so when compared with a reference.

In this manner, in a case where n converters are caused to perform the interleaving operation, an input electric current of the converter 530 and a ripple of an output electric current are reduced. This has an advantage of decreasing a capacity and a size of a circuit element within the electric power conversion module 700. Accordingly, the thickness of the junction box is smaller than the thickness of a frame 105 of the photovoltaic solar cell module.

On the other hand, as the interleaving converter, a tap inductor converter, a fly-back converter, or the like is used.

On the other hand, the communication unit 580 adds predetermined information to the alternating current power that results from the conversion in the inverter 540, and outputs the resulting alternating current power to the outside.

That is using the electric power line communication (PLC), the communication unit 58 outputs an alternating current power comprising information, which results from adding a carrier frequency signal comprising predetermined information to the alternating current power that results from the conversion in the inverter 530, to the gird.

The information at this time comprises at least one among information of an electric power generated by the photovoltaic module comprising the photovoltaic solar cell module, electric current information of the input into and the output from the photovoltaic module, voltage information of the input into and the output from the electric current information, operation state information of the photovoltaic module, and error information of the photovoltaic module. These pieces of information are generated by the controller 550.

On the other hand, the communication unit 580 within the branch photovoltaic module transmits a self-identification signal to the gateway 800, receives a self-identification signal of at least one nearby photovoltaic module 50, and transmits communication state information comprising reception sensitivity information of the self-identification signal of the at least one nearby photovoltaic module 50 to the gateway 800. In a case where the communication unit 580 receives a message from the gateway 800, the communication unit 580 transmits the message to the first photovoltaic module of at least one nearby photovoltaic module.

On the other hand, in a case where the gateway 800 needs to transmit a message to the photovoltaic module of at least one nearby photovoltaic module 50, without direct transmission between the gateway 800 and the first photovoltaic module, according to the information of the routing tree for a plurality of photovoltaic modules 50, which is generated in the gateway 800, the communication unit 580 within the branch photovoltaic module receives a message from the gateway 800, and transmits the received message to the first photovoltaic module.

On the other hand, the communication unit 580 within the branch photovoltaic module receives the information of the routing tree from the gateway 800. Correspondingly, based on the information of the routing tree, the controller 550 performs control in such a manner that the received message from the gateway 800 is transmitted to the first photovoltaic module that corresponds to a leaf photovoltaic module in the routing tree.

On the other hand, the communication unit 580 within the branch photovoltaic module transmits the communication state information comprising the reception sensitivity information of the self-identification signal, and then transmits electric power information generated in the photovoltaic module 50, to the gateway 800.

On the other hand, the communication unit 580 within the branch photovoltaic module periodically transmits the self-identification signal and the communication state information.

On the other hand, the communication unit 580 within the branch photovoltaic module receives a response message that corresponds to the message, from the first photovoltaic module, and transmits the response message to the gateway 800.

On the other hand, the communication unit 580 within the leaf photovoltaic module transmits a self-identification signal to the gateway 800, receives a self-identification signal of a nearby photovoltaic module 50, transmits communication state information comprising reception sensitivity information of the self-identification signal of the nearby photovoltaic module 50 to the gateway 800, and receives a message originated from the gateway 800, from the photovoltaic module of at least one nearby photovoltaic module 50.

On the other hand, in a case where the gateway 800 needs to transmit a message to the photovoltaic module 50, without direct transmission from the gateway 800, according to the information of the routing tree for the plurality of photovoltaic modules 50, which is generated in the gateway 800, the communication unit 580 within the leaf photovoltaic module receives the message from the first photovoltaic module.

On the other hand, the communication unit 580 within the leaf photovoltaic module receives the information of the routing tree, which is generated in the gateway 800, from the gateway 800. Correspondingly, based on the information of the routing tree, the controller 550 performs control in such a manner that the response message which corresponds to the message, to the first photovoltaic module that corresponds to a branch photovoltaic module in the routing tree.

On the other hand, the communication unit 580 within the leaf photovoltaic module transmits the communication state information comprising the reception sensitivity information of the self-identification signal, and then transmits the electric power information generated in the photovoltaic module 50, to the first photovoltaic module.

On the other hand, the communication unit 580 within the leaf photovoltaic module periodically transmits the self-identification signal and the communication state information.

FIG. 3 is an example of a block diagram of the inside of the gateway in FIG. 1.

With reference to the drawings, the gateway 800 receives pieces of information of the plurality of photovoltaic modules 50a, 50b, and so forth up to 50n from the grid through the electric power line communication.

To do this, the gateway 800 comprises the first communication unit 810, the controller 820, a second communication unit 830, the output unit 840, the power supply unit 850, and the memory 860.

The first communication unit 810 receives information from each of the plurality of photovoltaic modules 50a, 50b, and so forth up to 50n, and transmits the received information to the controller 820.

The received information is the photovoltaic electric power information from each of the plurality of photovoltaic solar cell modules 100a, 100b, and so forth up to 100n or each of the plurality of photovoltaic modules 50a, 50b, and so forth up to 50n, the electric current information or the voltage information of the input into and the output from the electric power conversion module 700 connected to the photovoltaic solar cell module, the error information of each of the photovoltaic solar cell modules 100a, 100b, and so forth up to 100n or each of the photovoltaic modules 50a, 50b, and so forth up to 50n, the operation state information of the grid, or the like.

The photovoltaic electric power information here is information on an amount of real-time generated power, which is generated in the photovoltaic solar cell module or the photovoltaic module.

For the electric power line communication at this time, a noise-resistant high-speed electric power line communication (PLC) scheme is preferably used. That is, at a communication speed of 1 Mbps or higher and in a bandwidth of 2 to 30 MHz, the first communication unit 810 receives the pieces of information of the plurality of photovoltaic modules 50a, 50b, and so forth up to 50n from the grid.

Then, the first communication unit 810 separates the carrier frequency signal from the alternating current power received, and extracts the information from the carrier frequency signal. Particularly, the first communication unit 810 extracts the added photovoltaic electric power information, using Orthogonal Frequency Division Multiplexing (OFDM). The extracted information is transmitted to the controller 820.

On the other hand, in a case where a problem occurs in the grid and thus the communication unit 570 of the electric power conversion module 700 transmits a direct current power with information being added to the direct current power, the first communication unit 810 can receive a direct current power to which the photovoltaic electric power information is added, from the grid.

The controller 820 signal-processes the photovoltaic electric power information received in the first communication unit 810, the electric current information and the voltage information of the electric power conversion module connected to the photovoltaic solar cell module, and the state information of the grid. Control is performed in such a manner that the signal-processed information and the like are stored in the memory 860.

Stored in the memory 860 are the photovoltaic electric power information received through the first communication unit 810, the electric current information and the voltage information of the electric power conversion module connected to the photovoltaic solar cell module, and the state information of the grid.

Stored in the memory 860 are particularly the photovoltaic electric power information received in real time, the electric current information and the voltage information of the electric power conversion module, which are received in real time, and the state information of the gird, which is received in real time.

The controller 820 generates the monitoring information possibly monitored, using the photovoltaic electric power information, the electric current information and the voltage information of the electric power conversion module, and the like, which for a predetermined time, are accumulated and are stored.

The monitoring information at this time comprises at least one among the photovoltaic electric power information, the electric current information and the voltage information of the input into and the output from the electric power conversion unit connected to the photovoltaic solar cell module, and the state information of the grid, which are for a predetermined period of time.

On the other hand, the controller 820 performs control in such a manner that the monitoring information is stored in the memory 860, or performs control in such a manner that through the output unit 840, the information is displayed or is output as audio.

On the other hand, the controller 820 performs control in such a manner that the monitoring information is transmitted to another apparatus, which is present in the outside world, through the second communication unit 830. For example, the monitoring information is transmitted to a nearby mobile terminal 600, or is transmitted to a server 300 or a mobile terminal 600 through a network 750.

The second communication unit 830 outputs the monitoring information with the monitoring information being added to a wireless signal. For example, the second communication unit 830 transmits the monitoring information to the mobile terminal 600 or a router connected to the second communication unit 830 in compliance with communication standards, such as Wi-Fi, Bluetooth, NFC, and Zigbee.

On the other hand, the second communication unit 830 outputs the monitoring information with the monitoring information being added to a cable signal. For example, the monitoring information is transmitted to a router, a PC, a meter, a data logger, a monitoring device 880, or the like connected to the second communication unit 830, for example, in a wired manner in compliance with Ethernet standards or RS 485 communication standards.

The second communication unit 830 is possibly connected to the server 300 or the mobile terminal 600 through a network or in a direct manner. The second communication unit 830 transmits the photovoltaic electric power information on a building in which the plurality of photovoltaic modules 50*a*, 50*b*, and so forth up to 50*n* are installed, or the photovoltaic electric power information that correspond to each of the photovoltaic modules, to the server 300 and the mobile terminal 600. Accordingly, the photovoltaic electric power information generated is known in a convenient and simple manner on a per-building or per-module basis.

On the other hand, the output unit 840 comprises a display, such as an LED, an LCD, and an OLED, and an audio output unit, such as a speaker. The monitoring information generated in the controller 820 is output through a display or an audio output unit of the output unit 840.

On the other hand, the power supply unit 850 can be supplied with a separate power from the outside. Accordingly, unlike a communication apparatus in the related art, which operates on an alternating current power that flows through the grid, the gateway 800 possibly operates even in a case where the alternating current power does not flow through the grid.

Furthermore, even in a case where an alternating current power does not flow through the grid, information is possibly received from each of the plurality of photovoltaic modules 50*a*, 50*b*, and so forth up to 50*n* through the first communication unit 810. In addition, even in a case where an alternating current power does not flow through the grid and where an alternating current power is not output from each of the plurality of photovoltaic modules 50*a*, 50*b*, and so forth up to 50*n*, the information is received using a direct current power, through the first communication unit 810. Therefore, the stable information reception is possible.

On the other hand, the first communication unit 810 of the gateway 800 receives the communication state information that comprises the self-identification signal and the reception sensitivity information of the self-identification signal, from the plurality of photovoltaic module 50.

Correspondingly, based on the communication state information, the controller 820 of the gateway 800 generates the routing tree for the plurality of photovoltaic modules 50.

On the other hand, based on information of the generated routing tree for transmitting a message to the first photovoltaic module among the plurality of photovoltaic modules 50, the first communication unit 810 of the gateway 800 transmits the message to the second photovoltaic module adjacent to the first photovoltaic module.

On the other hand, the first communication unit 810 of the gateway 800 transmits the information of the generated routing tree to the plurality of photovoltaic modules 50.

On the other hand, based on the information of the generated routing tree, the first communication unit 810 of the gateway 800 receives the electric power information from the plurality of photovoltaic modules 50.

On the other hand, when transmitting a message to a leaf photovoltaic module 50, the first communication unit 810 of the gateway 800 transmits the message directly to a branch photovoltaic module 50.

On the other hand, based on the information of the generated routing tree, the controller 820 of the gateway 800 sets one or several photovoltaic modules, among the plurality of photovoltaic modules 50, to be branch photovoltaic modules 50, and sets one other or several other photovoltaic modules to be leaf photovoltaic modules 50 that are at lower level in the routing tree than the branch photovoltaic modules.

On the other hand, in a case where the reception sensitivity information of the self-identification signal indicates a first predetermined value or lower, the controller 820 of the gateway 800 performs the setting to the leaf photovoltaic module. In a case where the reception sensitivity information of the self-identification signal indicates a value higher than the first predetermined value, the controller 820 of the gateway 800 performs the setting to the branch photovoltaic module.

On the other hand, the controller 820 of the gateway 800 periodically updates the routing tree.

Figure 4:
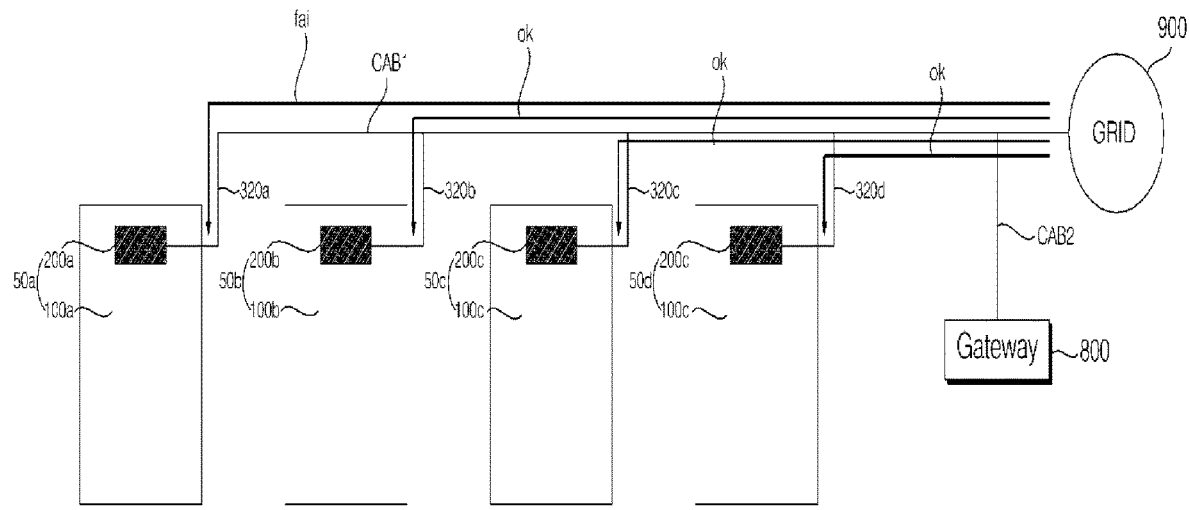
FIGS. 4 and 5 are diagrams illustrating that electric power line communication is performed.
Figure 5:
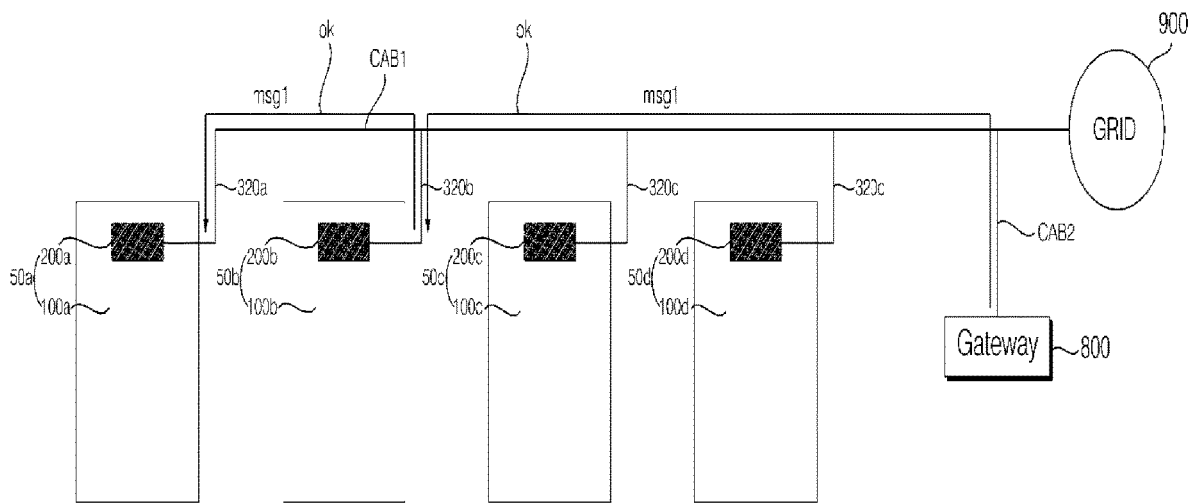

FIGS. 4 and 5 are diagrams illustrating that the electric power line communication is performed.

First, for reference, FIG. 4 illustrates that the photovoltaic system 10 comprises a plurality of photovoltaic modules 50a to 50d and the gateway 800.

For convenience of description, four photovoltaic modules, instead of the n photovoltaic modules that are illustrated in FIG. 1, will be described below as being present within the photovoltaic system 10.

FIG. 4 illustrates that the plurality of photovoltaic modules 50a to 50d perform direct data communication with the gateway 800.

Particularly, it is illustrated that a message is transmitted directly from the gateway 800 to each of the plurality of photovoltaic modules 50a to 50d through the electric power line communication.

Of the plurality of photovoltaic modules 50a to 50d, the fourth photovoltaic module 50d the closest to the gateway 800 performs the smoothest electric power line communication, followed by the third photovoltaic module 50c, the second photovoltaic module 50b, and the first photovoltaic module 50a, in that order.

On the other hand, in the drawings, it is illustrated that the first photovoltaic module 50a the farthest from the gateway 800 fails (i.e., fail) to transmit a message. In addition, it is illustrated that the transmission of the message to the second to fourth photovoltaic modules 50b to 50d succeeds (i.e., Ok).

On the other hand, in a case where the transmission of the message to the first photovoltaic module 58a in FIG. 4 fails, the gateway 800 makes one more attempt to transmit a message msg1 to the first photovoltaic module 50a. Then, in a case where the transmission of the message fails a predetermined number of times, the gateway 800, as illustrated in FIG. 5, transmits the message msg1 to the second photovoltaic module 50b (i.e., Ok).

Then, the second photovoltaic module 50b transmits the received message msg1 to the first photovoltaic module 50a (i.e., Ok).

With a method of transmitting a message, which is illustrated in FIGS. 4 and 5, in a case where the direct transmission between the first photovoltaic module 50a and the gateway 800 fails, the attempt to transmit the message is made a predetermined number of times, and thereafter, the transmission of the message to the first photovoltaic module 50a is performed using a nearby photovoltaic module.

This method has an advantage in that, in a case where the electric power line communication is temporarily impossible in any one of the plurality of photovoltaic modules, the transmission of the message fails, or the transmission of the message is performed after a considerable amount of time elapsed.

Accordingly, according to the present invention, a method is proposed in which, in such situations as ones in FIGS. 4 and 5, a routing tree suitable for the electric power line communication environment is generated in real time and in which the optimal message reception or transmission can be possible with the correspondence to the routing tree. This method will be described below with reference to FIGS. 6A and 6B and subsequent figures.

Figure 6A:
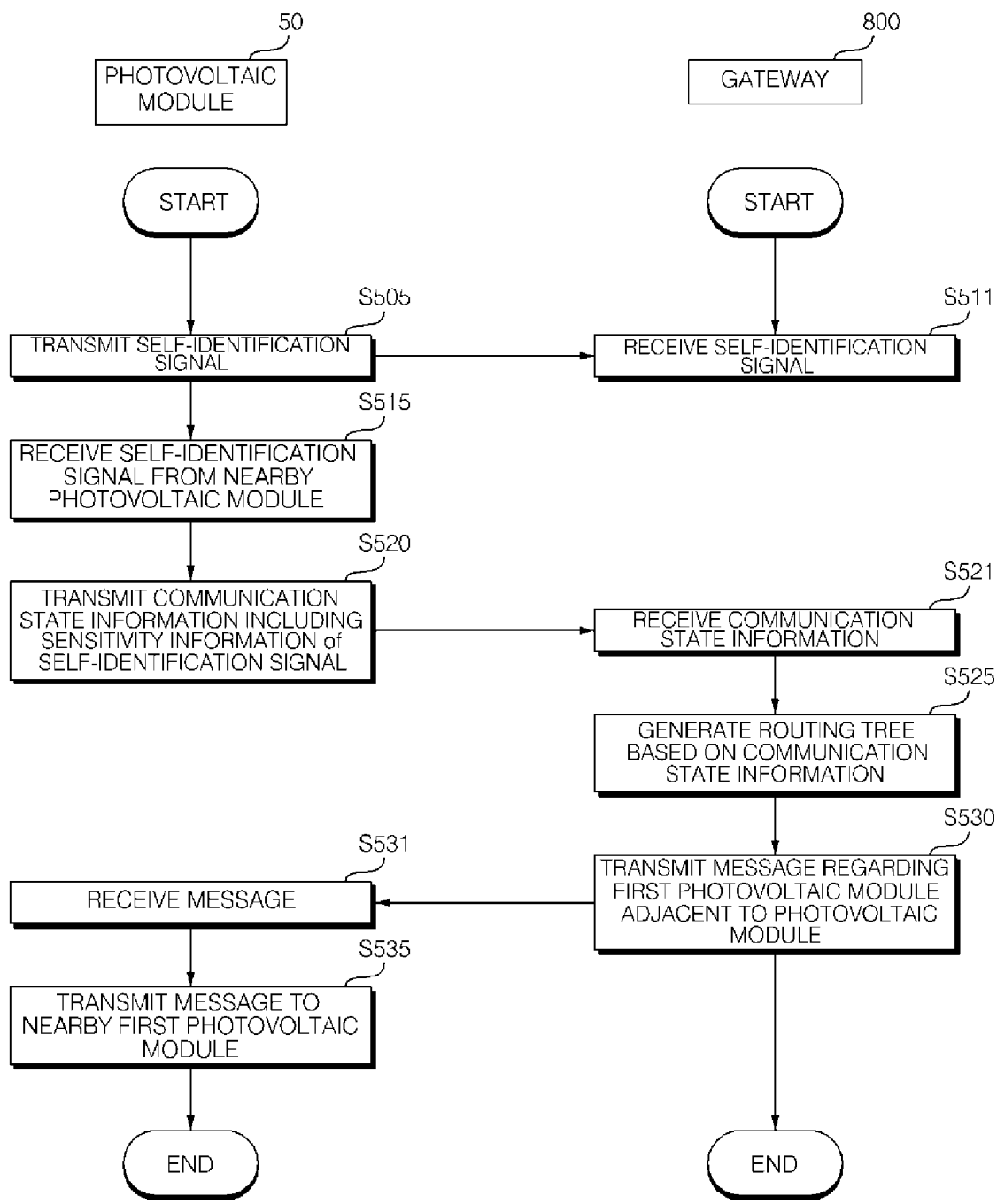
FIG. 6A is a flowchart illustrating a method of operating the photovoltaic system according to the embodiment of the present invention.
Figure 6B:
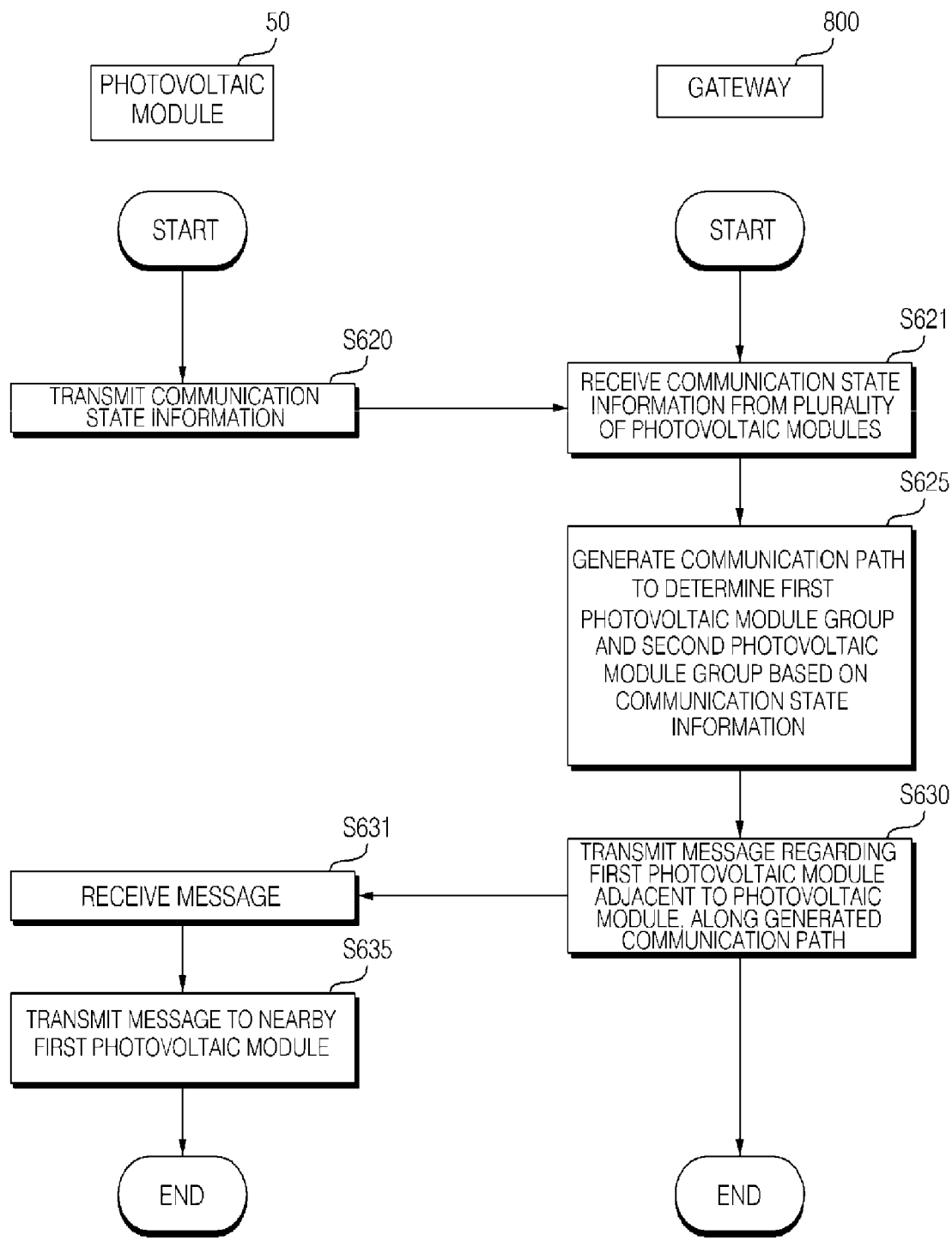
FIG. 6B is a flowchart illustrating a method of operating the photovoltaic system according to another embodiment of the present invention.

FIG. 6A is a flowchart illustrating a method of operating the photovoltaic system according to the embodiment of the present invention. FIG. 6B is a flowchart illustrating a method of operating the photovoltaic system according to another embodiment of the present invention. FIGS. 7A to 11C are diagrams that are referred to for descriptions of the methods of operating photovoltaic system in FIG. 6A or 6B.

Particularly, FIGS. 6A and 6B are flowcharts illustrating various methods of communication between the photovoltaic module and the gateway.

First, with reference to FIG. 6A, the plurality of photovoltaic modules 50a to 50d within the photovoltaic system transmit their respective self-identification signals (S505). Accordingly, the gateway 800 receives the self-identification signals from the plurality of photovoltaic modules 50a to 50d (S511). The self-identification signal at this time is a signal comprising ID information of each of the photovoltaic modules.

On the other hand, the plurality of photovoltaic modules 50a to 50d transmit their respective self-identification signal at different times.

On the other hand, the plurality of photovoltaic modules 50a to 50d within the photovoltaic system 10 receive their respective self-identification signal from nearby photovoltaic modules (S515).

Figure 7A:
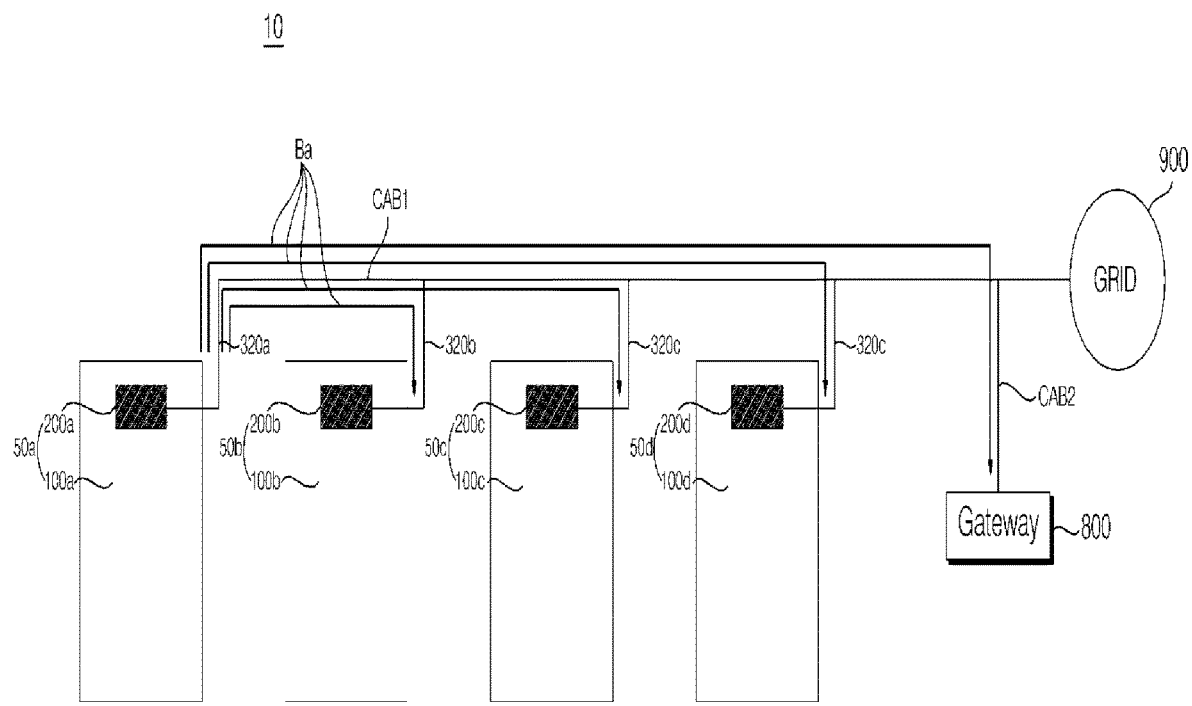
FIGS. 7A to 11C are diagrams that are referred to for descriptions of the methods of operating the photovoltaic system in FIGS. 6A and 5B.

FIG. 7A illustrates that among the plurality of photovoltaic modules 50a to 50d, the first photovoltaic module 50a transmits its self-identification signal Ba at a first point in time.

Accordingly, the second to fourth photovoltaic modules 50b to 50d, and the gateway 800 receive the self-identification signal Ba.

Figure 7B:
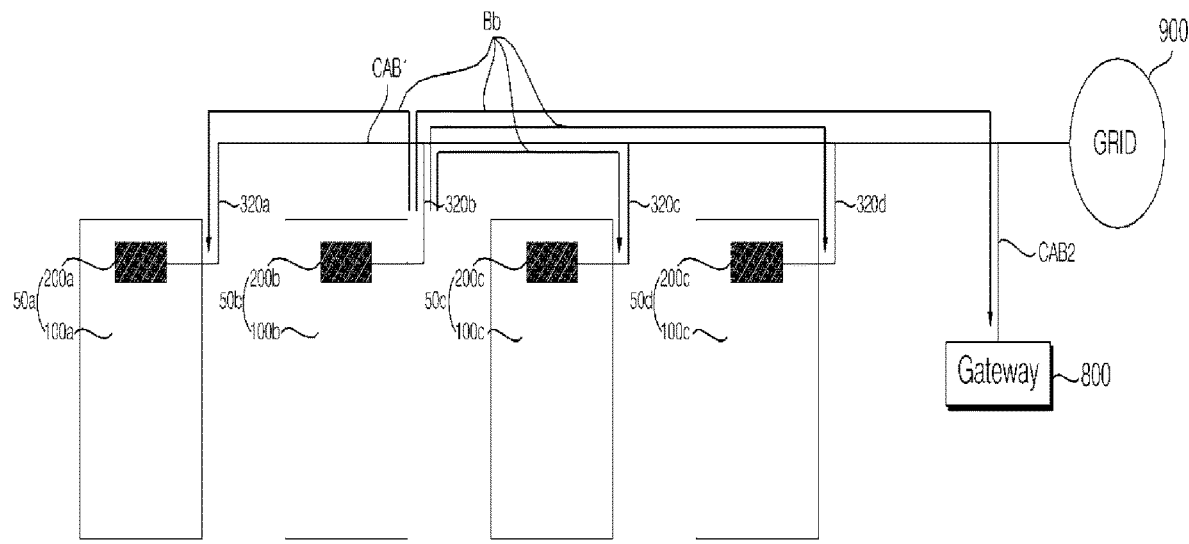

Next, FIG. 7B illustrates that among the photovoltaic modules 50a to 50d, the second photovoltaic module 50b transmits its self-identification signal Bb at a second point in time after the first point in time.

Accordingly, the first, third, and fourth photovoltaic modules 50a, 50c, and 50d, and the gateway 800 receive the self-identification signal Bb.

Figure 7C:
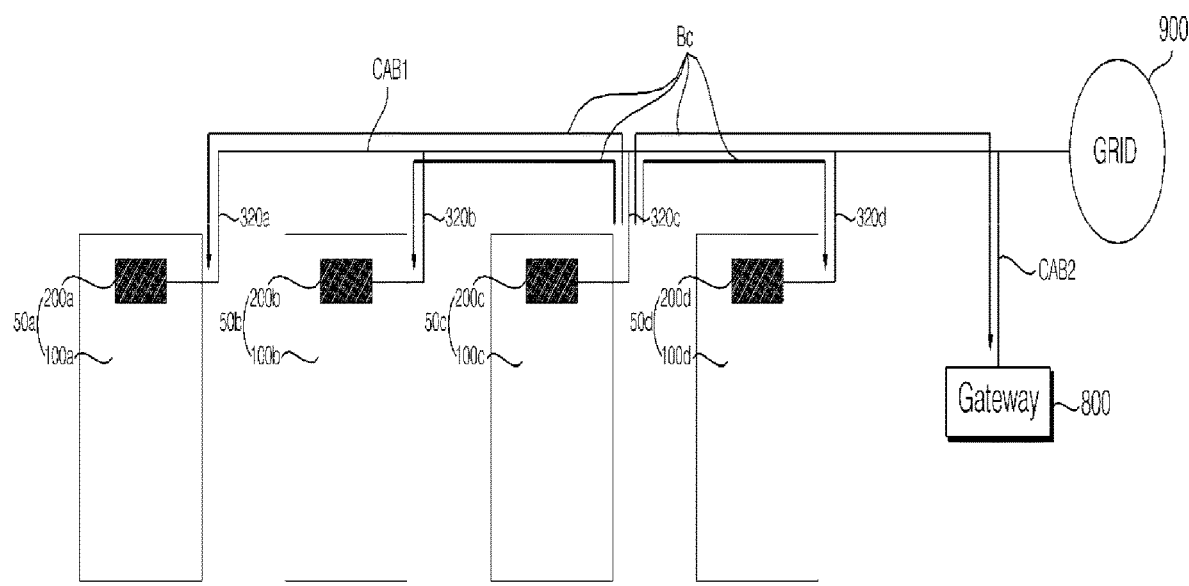

Next, FIG. 7C illustrates that among the photovoltaic modules 50a to 50d, the third photovoltaic module 50c transmits its self-identification signal Bc at a third point in time after the second point in time.

Accordingly, the first, second, and fourth photovoltaic modules 50a, 50b, and 50d, and the gateway 800 receive the self-identification signal Bc.

Figure 7D:
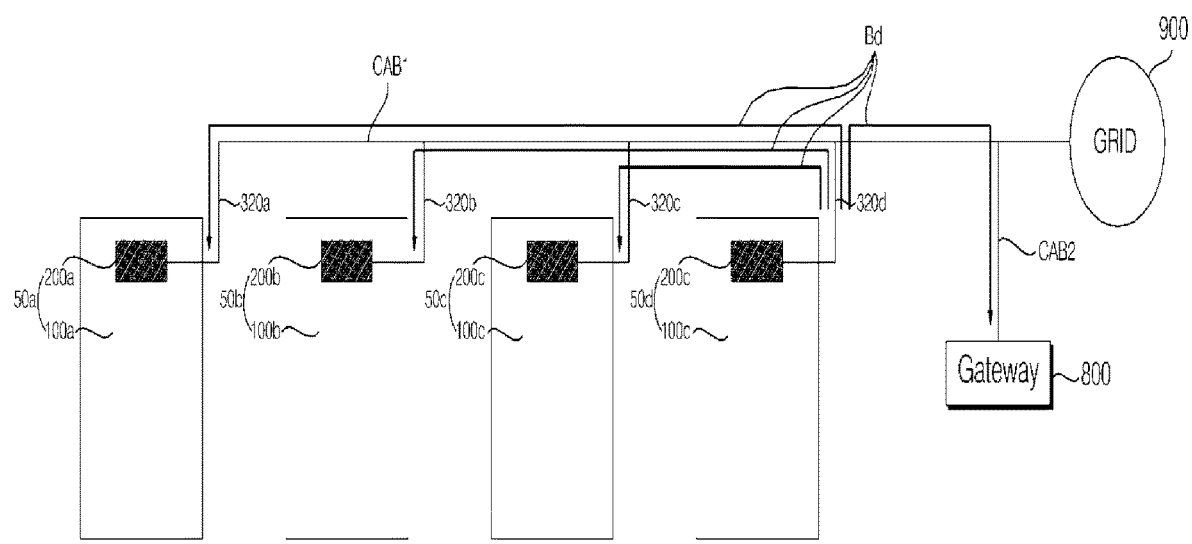

Next, FIG. 7D illustrates that among the photovoltaic modules 50a to 50d, the fourth photovoltaic module 50d transmits its self-identification signal Bd at a fourth point in time after the third point in time.

Accordingly, the first to third photovoltaic modules 50a to 50c, and the gateway 800 receive the self-identification signal Bd.

Next, the plurality of photovoltaic modules 50a to 50d within the photovoltaic system 10 transmit their respective pieces of communication state information that comprise the pieces of information, respectively, on the receiver sensitivities of the self-identification signals that are received from their respective nearby photovoltaic modules, to the gateway 800 (S520).

Accordingly, the gateway 800 receives the communication state information comprising the information on the receiver reception of the self-identification signal from each of the plurality of photovoltaic modules 50a to 50d (S521).

Figure 7E:
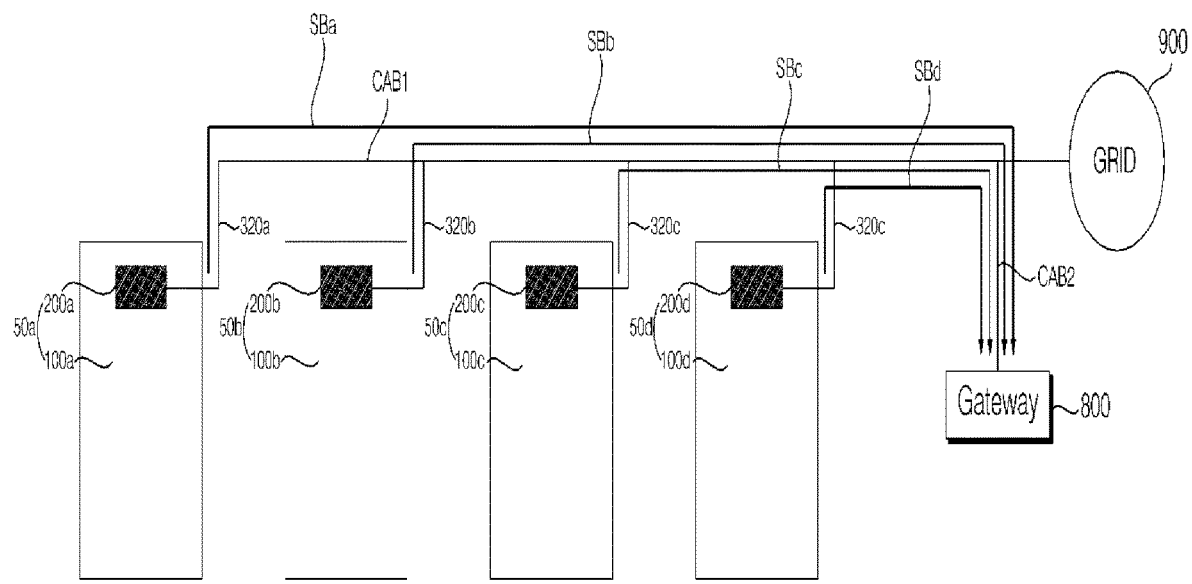

FIG. 7E illustrates that the plurality of photovoltaic modules 50a to 50d transmit their respective pieces of communication state information SBa, SBb, SBc and SBd, each of which comprises the information on the reception sensitivity information.

At this time, the communication state information comprises the self-identification information of the photovoltaic module and the reception sensitivity information of the self-identification signal of at least one nearby photovoltaic module.

On the other hand, the information on the reception sensitivity comprises information on signal strength of the self-identification signal of at least one nearby photovoltaic module.

In the drawings, it is illustrated that the plurality of photovoltaic modules 50a to 50d transmit their respective pieces of communication state information SBa to SBd, each of which comprises the information on the receiver sensitivity, at the same time, but various modifications to this transmission technique are possible.

For example, the communication state information comprising the reception sensitivity information is possibly transmitted in the order in which the self-identification signals are transmitted.

Specifically, the first photovoltaic module 50a first transmits the communication state information that comprises the information on the receiver information. Then, the second photovoltaic module transmits the communication state information that comprises the information on the receiver information, followed by the third photovoltaic module and the fourth photovoltaic module in that order.

Next, based on self-identification signals Ba to Bd that are received and on the pieces of communication state information SBa to SBd, each of which comprises the information on the receiver sensitivity, and which are received, the gateway 800 within the photovoltaic system 10 generates a routing tree that corresponds to a current electric power line communication (S525).

Figure 7F:
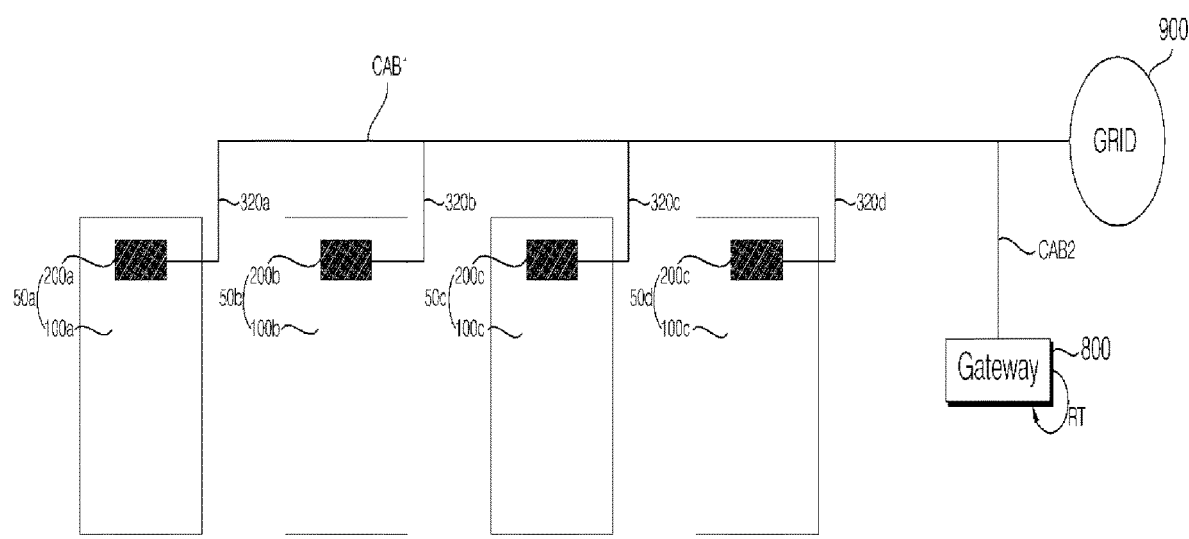

FIG. 7F illustrates that based on the self-identification signals Ba to Bd that are received and on the pieces of communication state information SBa to SBd, each of which comprises the information on the receiver sensitivity, and which are received, the gateway 800 generates a routing tree (RT) that corresponds to the current electric power line communication.

Particularly, in a case where the reception sensitivity information of the self-identification signal indicates the first predetermined value or lower, the controller 820 of the gateway 800 performs the setting to the leaf photovoltaic module. In a case where the reception sensitivity information of the self-identification signal indicates a value higher than the first predetermined value, the controller 820 of the gateway 800 performs the setting to the branch photovoltaic module.

The branch photovoltaic module here means a photovoltaic module that possibly communicates directly with the gateway 800, and the leaf photovoltaic module means a photovoltaic module that possibly communicates directly with the branch photovoltaic module, instead of communicating directly with the gateway 800.

Next, the gateway 800 within the photovoltaic system 10 transmits a first message destined for the first photovoltaic module adjacent to a photovoltaic module (S530).

Then, the photovoltaic module 50 receives the message (S531), and transmits the received message to the nearby first photovoltaic module (S535).

Accordingly, even in a case where the direct communication between the first photovoltaic module and the gateway 800 is impossible, the message is rapidly transmitted to the first photovoltaic module via another photovoltaic module 50.

On the other hand, the message is an electric power information transmission request message, a firmware update message, a voltage information transmission message, or the like.

Next, if a description is provided with reference to FIG. 6B, operation 505 to operation 515 in FIG. 6A are performed as are.

Next, the plurality of photovoltaic modules 50a to 50d within the photovoltaic system 10 transmit their respective pieces of communication state information that comprise the pieces of information, respectively, on the receiver sensitivity of the self-identification signals that are received from their respective nearby photovoltaic module, to the gateway 800 (S620).

Accordingly, the gateway 800 receives the communication state information comprising the information on the receiver reception of the self-identification signal from each of the plurality of photovoltaic modules 50a to 50d (S621).

At this time, the communication state information comprises the self-identification information of the photovoltaic module and the reception sensitivity information of the self-identification signal of at least one nearby photovoltaic module.

Next, based on the communication state information from each of the plurality of photovoltaic modules, the gateway 800 generates a communication path that determines a first photovoltaic module group that possibly transmits a message directly to the gateway 800 and a second photovoltaic module group that possibly transmits a message via at least one photovoltaic module in the first photovoltaic module group (S625).

The first photovoltaic module group corresponds to a branch photovoltaic module group, and the second photovoltaic module group corresponds to a leaf photovoltaic module group.

Operation 625 corresponds to operation 525. Based on the pieces of communication state information SBa to SBd, each of which receives the information on the receiver sensitivity, and which are received, the gateway 800 determines the first photovoltaic module group and the second photovoltaic module group. In the meantime, the gateway 800 generates a routing tree that corresponds to an electric power line communication.

On the other hand, when generating the communication path in operation 625, the gateway 800 generates a communication path along which direct transmission between each of the photovoltaic modules is possible, based on information on a communication state between each of the photovoltaic modules.

Next, when transmitting a message to any one of the plurality of photovoltaic modules, the gateway 800 transmits the message along the communication path generated in advance (S630).

Correspondingly, the branch photovoltaic module that belongs to the first photovoltaic module group receives the message from the gateway 800 (S631).

Then, the branch photovoltaic module transmits the message received, to the leaf photovoltaic module that belongs to the second photovoltaic module group (S635).

On the other hand, when transmitting the message in operation 635, in a case where a photovoltaic module to transmit the message belongs to the second photovoltaic module group, the gateway 800 transmits the message via a photovoltaic module that belongs to the first photovoltaic module group, referring to the communication path between each of the photovoltaic modules.

In addition, unlike in operation 635, in a case where a photovoltaic module to transmit the message belongs to the first photovoltaic module group, the gateway 800 transmits the message directly to the photovoltaic module.

Accordingly, even in the case where the direct communication between the first photovoltaic module and the gateway 800 is impossible, the message is rapidly transmitted to the first photovoltaic module via the photovoltaic module 50.

FIG. 8A to 8E are diagrams that illustrate various routing trees, respectively.

Based on the self-identification signals Ba to Bd that are received and on the pieces of communication state information SBa to SBd, each of which comprises the information on the receive sensitivity, and which are received, the gateway 800 generates various routing trees, for example as are illustrated in FIGS. 8A to 8E.

Particularly, in the case where the reception sensitivity information of the self-identification signal indicates the first predetermined value or lower, the controller 820 of the gateway 800 performs the setting to the leaf photovoltaic module. In the case where the reception sensitivity information of the self-identification signal indicates a value higher than the first predetermined value, the controller 820 of the gateway 800 performs the setting to the branch photovoltaic module.

On the other hand, the branch photovoltaic module, the leaf photovoltaic module, and the like, which are described above, are set to be within the routing tree.

First, FIG. 8A illustrates that because receiver reception sensitivity information of the first photovoltaic module 50a indicates the first predetermined value or lower, the first photovoltaic module 50a is set to be a leaf photovoltaic module at a lower level in the routing tree than the second photovoltaic module 50b.

On the other hand, FIG. 8A illustrates that receiver reception sensitivity information of each of the second to fourth photovoltaic modules 50b to 50d indicates a value higher than the first predetermined value, each of the second to fourth photovoltaic modules 50b to 50d is set to be a branch photovoltaic module.

Figure 8B:
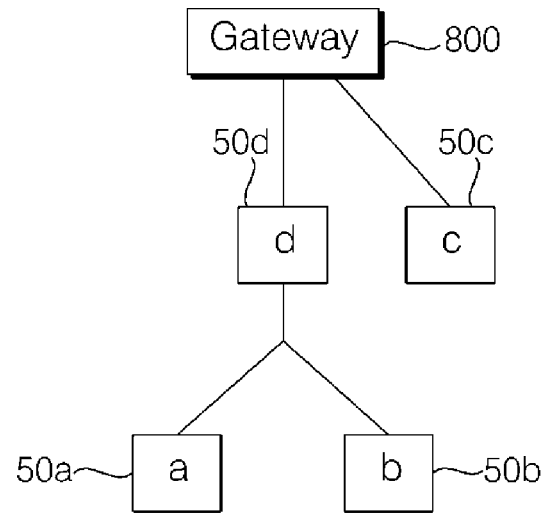

Next, FIG. 8B illustrates that the third and fourth photovoltaic modules 50c and 50d are set to be branch photovoltaic modules and that the first and second photovoltaic modules 50a and 50b are set to be leaf photovoltaic module under the fourth photovoltaic module 50d.

Figure 8C:
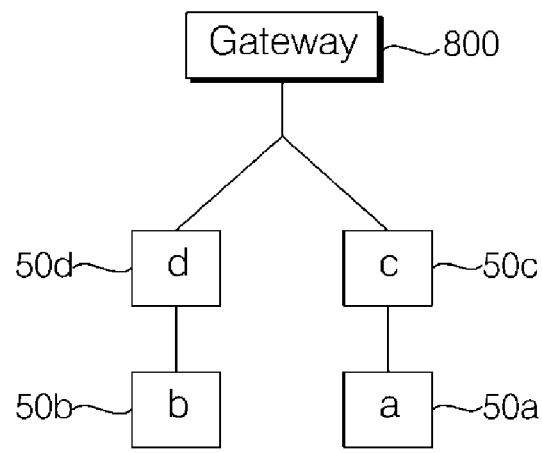

Next, FIG. 8C illustrates that the third and fourth photovoltaic modules 50c and 50d are set to be branch photovoltaic modules and that the first and second photovoltaic modules 50a and 50b are set to be leaf photovoltaic modules under the third and fourth photovoltaic modules 50c and 50d, respectively.

Figure 8D:
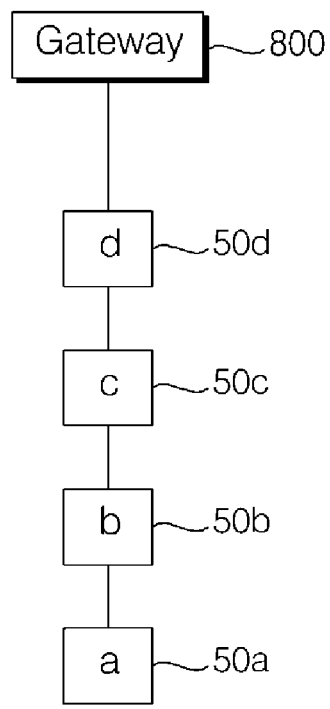

Next, FIG. 8D illustrates that the fourth photovoltaic module 50d is set to be a branch photovoltaic module, the third photovoltaic module 50c is set to be under the fourth photovoltaic module 50d, the second photovoltaic module 50b is set to be under the third photovoltaic module 50c, and the first photovoltaic module 50a is set to be a leaf photovoltaic module under the second photovoltaic module 50b.

Figure 8E:
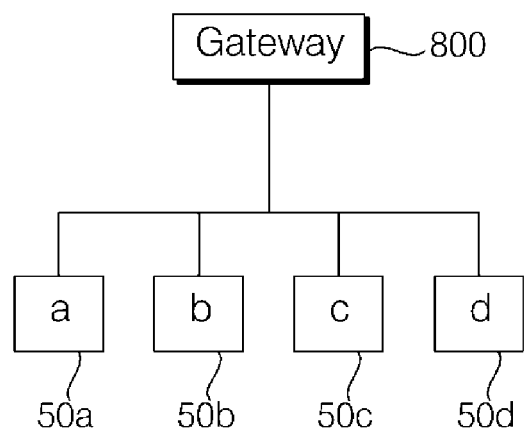

Next, FIG. 8E illustrates that the first to fourth photovoltaic modules 50a to 50d are all set to be branch photovoltaic modules.

Figure 9A:
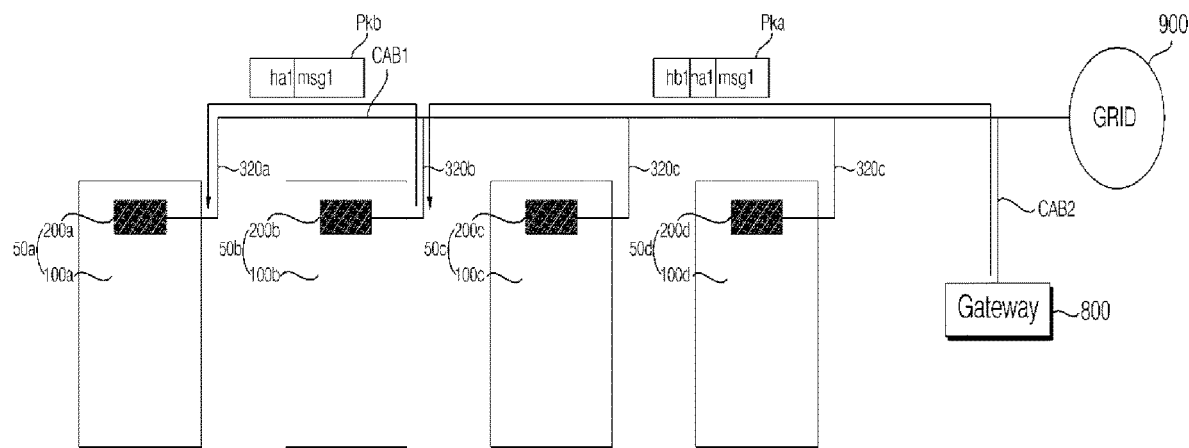

FIG. 9A is a diagram illustrating that the message msg1 is transmitted from the gateway 800 to the first photovoltaic module 50b in the routing tree in FIG. 8A.

With reference to the drawings, the gateway 800 transmits the message msg1 to the second photovoltaic module 50b the branch photovoltaic module.

Particularly, the gateway 800 transmits the message msg1 and a first packet Pka that comprises a header hb1 for the second photovoltaic module and a header ha1 for the first photovoltaic module.

With the header hb1 for the second photovoltaic module, the second photovoltaic module 50b receives the first packet Pka.

Next, the second photovoltaic module 50b transmits a second packet Pkb that results from removing the header hb1 for the second photovoltaic module from the first packet Pka, to the first photovoltaic module 50a.

Accordingly, the message msg1 is rapidly transmitted to the first photovoltaic module 50a.

Figure 9B:
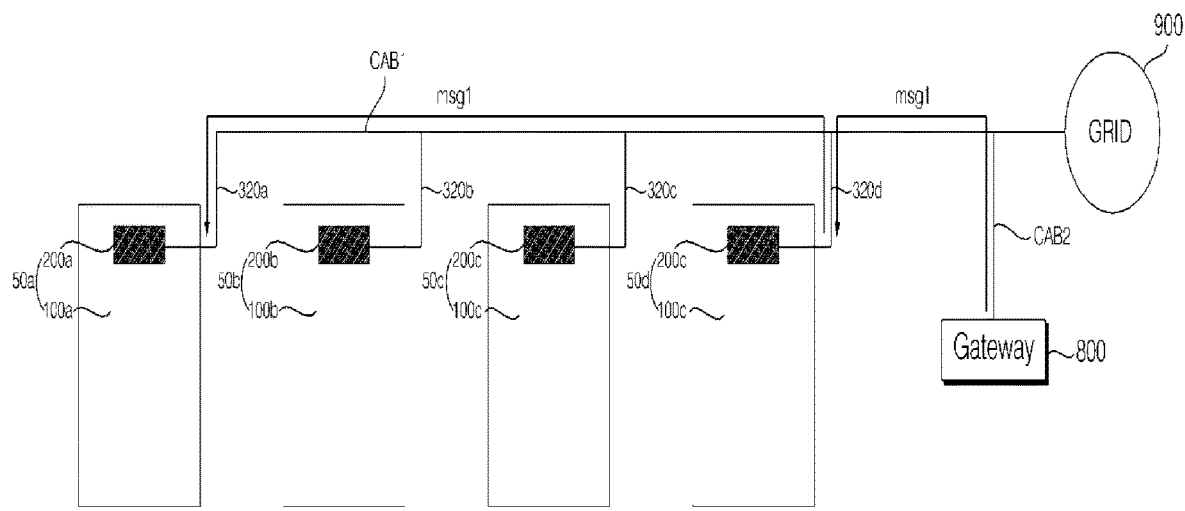

FIG. 9B is a diagram illustrating that the message msg1 is transmitted from the gateway 800 to the first photovoltaic module 50b in the routing tree in FIG. 8B.

With reference to the drawings, the gateway 800 transmits the message msg1 to the fourth photovoltaic module 50d the branch photovoltaic module.

Then, the fourth photovoltaic module 50d transmits the message msg1 to the first photovoltaic module 50a.

Accordingly, the message msg1 is rapidly transmitted to the first photovoltaic module 50a.

Figure 9C:
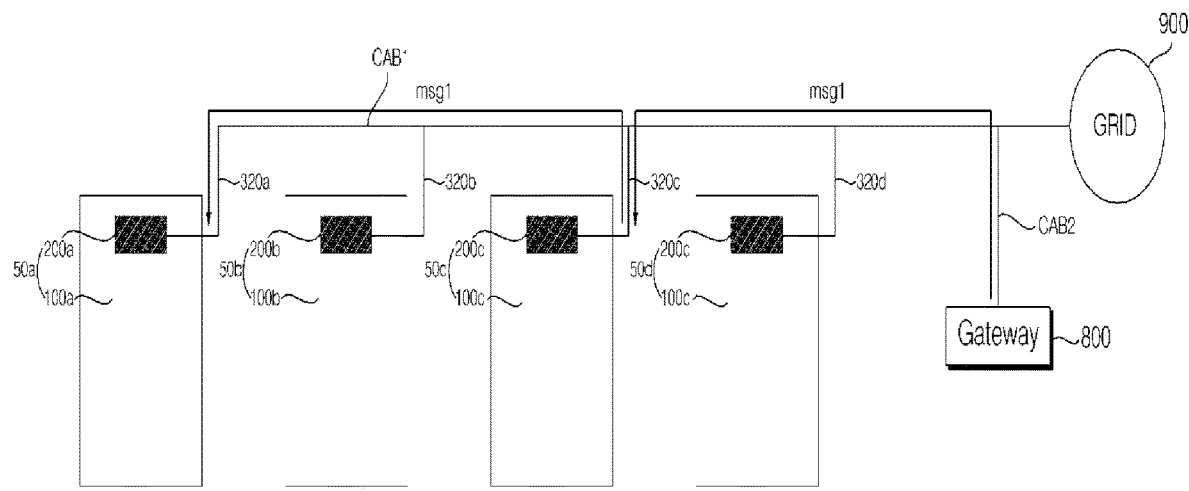

FIG. 9C is a diagram illustrating that the message msg1 is transmitted from the gateway 800 to the first photovoltaic module 50b in the routing tree in FIG. 8C.

With reference to the drawings, the gateway 800 transmits the message msg1 to the third photovoltaic module 50c the branch photovoltaic module.

Then, the fourth photovoltaic module 50d transmits the message msg1 to the first photovoltaic module 50a.

Accordingly, the message msg1 is rapidly transmitted to the first photovoltaic module 50a.

On the other hand, the first photovoltaic module 50a transmits a response message to the outside according to the message msg1. The response message here comprises the electric power information and the like. The details of this will be described with reference to FIGS. 10A to 10C.

Figure 10A:
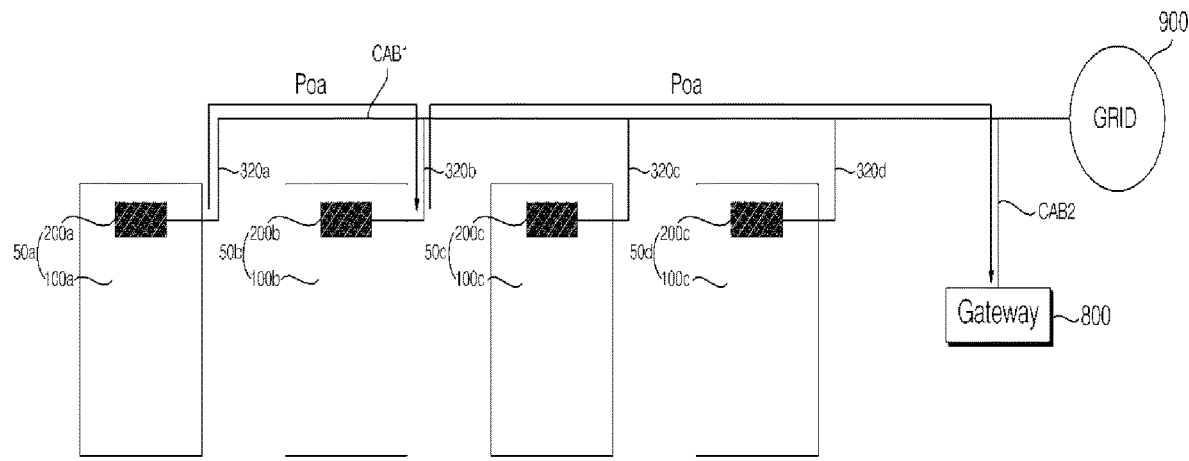

FIG. 10A is a diagram illustrating that electric power information Poa is transmitted from the first photovoltaic module 50b to the gateway 800 in the routing tree in FIG. 8A.

With reference to the drawings, the first photovoltaic module 50b transmits the electric power information Poa to the second photovoltaic module 50b the branch photovoltaic module.

Next, the second photovoltaic module 50b transmits the electric power information Poa to the gateway 800.

Accordingly, the electric power information Poa is rapidly transmitted to the gateway 800.

Figure 10B:
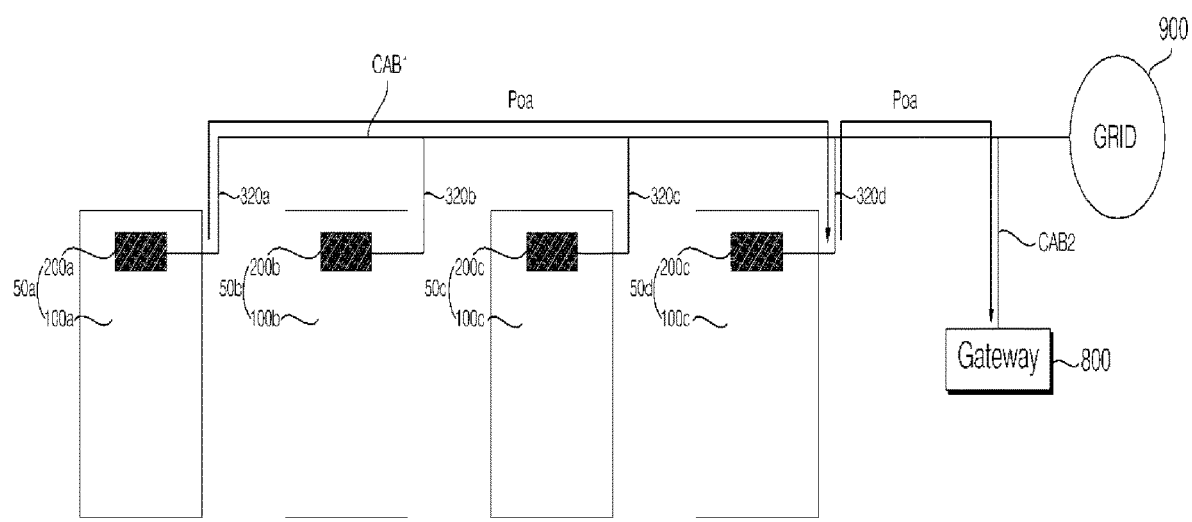

FIG. 10B is a diagram illustrating that the electric power information Poa is transmitted from the first photovoltaic module 50b to the gateway 800 in the routing tree in FIG. 8B.

With reference to the drawings, the first photovoltaic module 50b transmits the electric power information Poa to the fourth photovoltaic module 50d the branch photovoltaic module.

Next, the fourth photovoltaic module 50d transmits the electric power information Poa to the gateway 800.

Accordingly, the electric power information Poa is rapidly transmitted to the gateway 800.

Figure 10C:
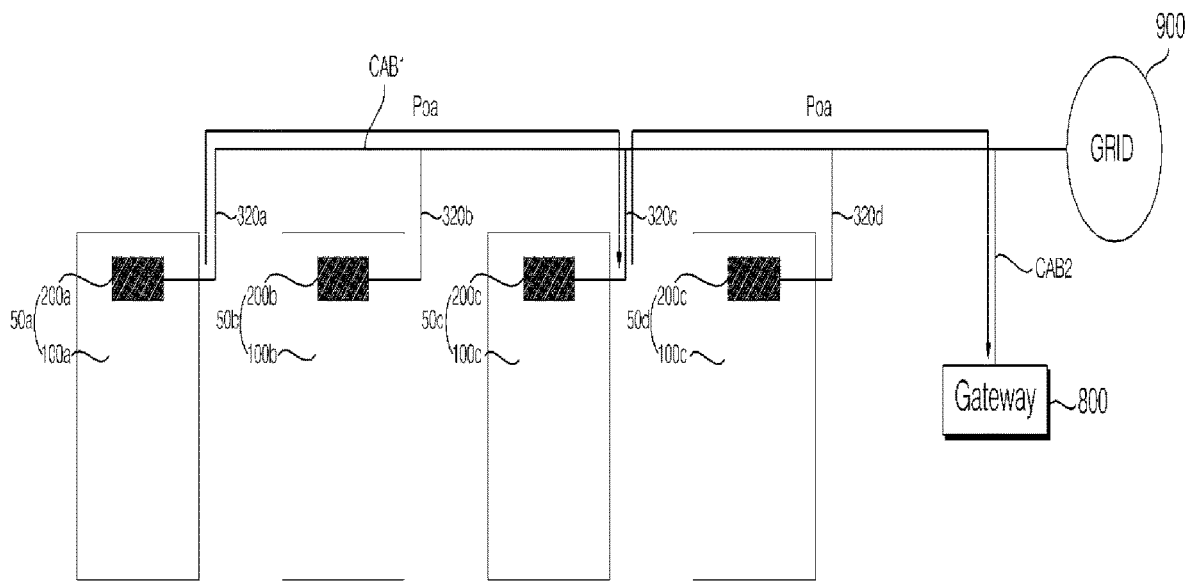

FIG. 10C is a diagram illustrating that the electric power information Poa is transmitted from the first photovoltaic module 50b to the gateway 800 in the routing tree in FIG. 8C.

With reference to the drawings, the first photovoltaic module 50b transmits the electric power information Poa to the third photovoltaic module 50c the branch photovoltaic module.

Next, the third photovoltaic module 50c transmits the electric power information Poa to the gateway 800.

Accordingly, the electric power information Poa is rapidly transmitted to the gateway 800.

Figure 11A:
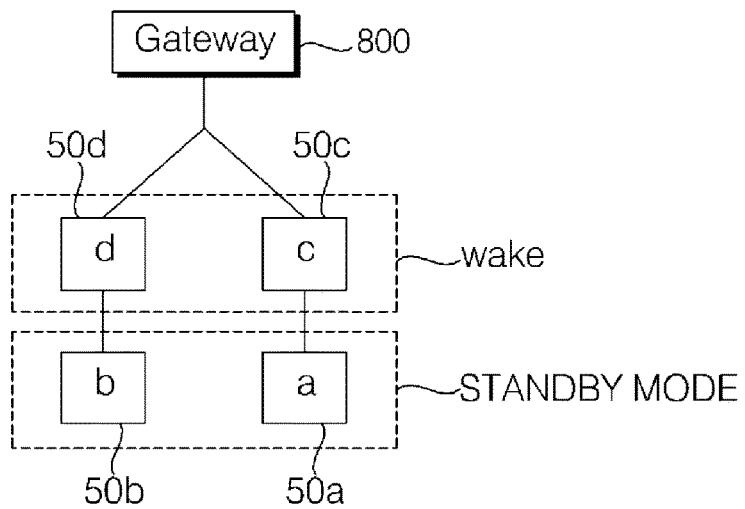
Figure 11B:
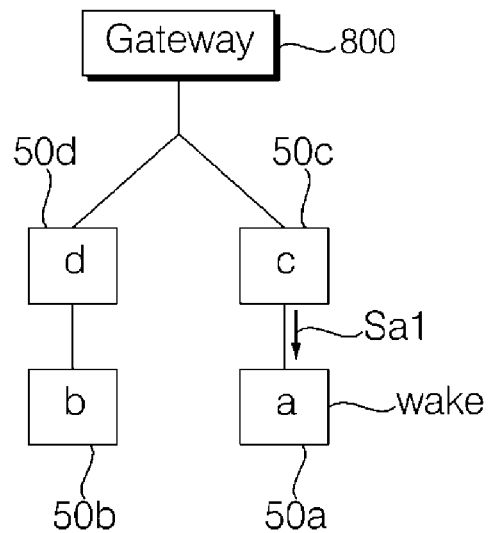
Figure 11C:
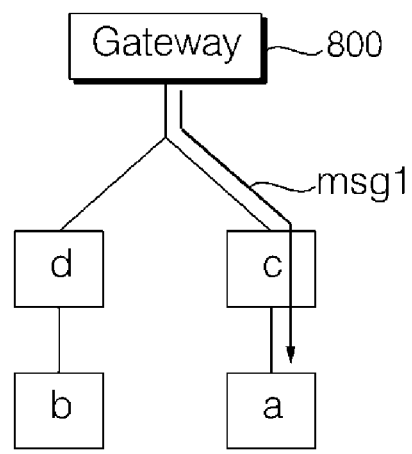

Next, FIGS. 11A to 11C are diagrams illustrating transmission of a signal and the like between the branch photovoltaic module and the leaf photovoltaic module in the routing tree in FIG. 8C.

With reference to FIG. 11A, the third and fourth photovoltaic modules 50c and 50d are set to be branch photovoltaic modules and the first and second photovoltaic modules 50a and 50b are set to be leaf photovoltaic modules under the third and fourth photovoltaic modules 50c and 50d, respectively.

Accordingly, the first and second photovoltaic modules 50a and 50b that are the leaf photovoltaic modules periodically enter a low electric power mode. That is, a standby mode (STANDBY MODE) is entered.

Then, the third and fourth photovoltaic modules 50c and 50d that are the branch photovoltaic modules have a shorter section for the low electric power mode than the first and second photovoltaic modules 50a and 50b.

That is, the communication unit 580 of the branch photovoltaic module preferably has a short section for the standby mode than the communication unit 580 of the leaf photovoltaic module.

In the drawings, it is illustrated that the first and second photovoltaic modules 50a and 50b are in a wake-up state (WAKE) and that the third and fourth photovoltaic modules 50c and 50d are in a standby mode state.

That is, the communication unit 580 of each of the first and second photovoltaic modules 50a and 50b is in the wake-up state, and the communication units 580 of each of the third and fourth photovoltaic modules 50c and 50d is in the standby mode state.

On the other hand, FIG. 11B illustrates that a control signal Sa1 for setting the first photovoltaic module 50a in the standby mode to be in the wake-up state is output in the third photovoltaic module 50b.

Accordingly, the first photovoltaic module 50a enters the wake-up state.

Next, FIG. 11C illustrates that after the first photovoltaic module 50a enters the wake-up state, the message msg1 is transmitted from the gateway 800 to the first photovoltaic module 50a via the third photovoltaic module 50b.

Since the first photovoltaic module 50a is in the wake-up state, the message msg1 is smoothly transmitted from the gateway 800.

On the other hand, unlike in FIGS. 11B and 11C, in a case where the message msg1 is transmitted from the gateway 800 to the third photovoltaic module 50b, the control signal Sa1 for setting the first photovoltaic module 50a to be in the wake-up state is possibly also output in the third photovoltaic module 50b.

Then, after the first photovoltaic module 50a enters the wake-up state, it also possible that the massage msg1 is output from the third photovoltaic module 50b and is transmitted to the first photovoltaic module 50a.

Figure 12:
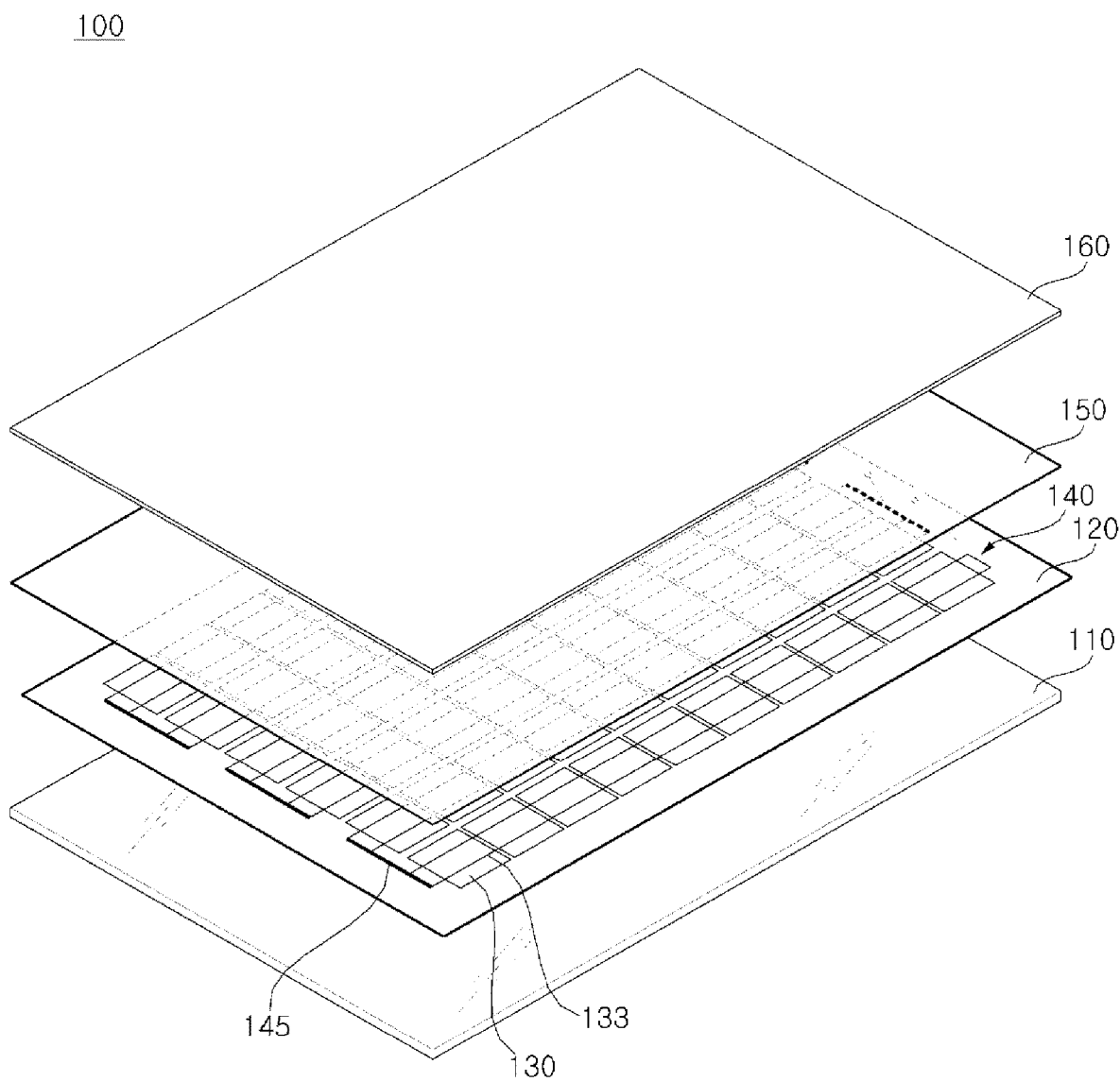
FIG. 12 is a perspective exploded diagram of the photovoltaic solar cell module in FIG. 1.

FIG. 12 is a perspective exploded diagram of the photovoltaic solar cell module in FIG. 1.

With reference to FIG. 12, the photovoltaic solar cell module 100 in FIG. 1 comprises a plurality of photovoltaic solar cells 130. Additionally, the photovoltaic solar cell module 100 further comprises a first sealing material 120 and a second sealing material 150 that are positioned on the lower surfaces and the upper surfaces, respectively, of a plurality of photovoltaic solar cells 130, a rear substrate 110 positioned on the lower surface of the first sealing material 120, and a front substrate 160 positioned on the upper surface of the second sealing material 150.

First, the photovoltaic solar cell 130 is a semiconductor element that converts solar energy into a flow of electrons, and is a silicon solar cell, a compound semiconductor solar cell, a tandem solar cell, a dye-sensitized solar cell, a CdTe thin-film solar cell, a CIGS thin-film solar cell, or a thin-film solar cell, or the like.

The photovoltaic solar cell module 130 is formed to have a light receiving surface and the rear surface opposite in direction to the light receiving surface. For example, the photovoltaic solar cell module 130 comprises a first conductive silicon substrate, a second conductive semiconductor layer formed on the silicon substrate and has conductivity which is opposite to first conductivity, a reflection-prevention film that comprises at least one or more openings through which a portion of a surface of the second conductive semiconductor layer is exposed and is formed on the second conductive semiconductor layer, a front-surface electrode in contact with a portion of a surface of the second conductive semiconductor layer exposed through the at least one or more openings, and a rear electrode formed on a rear-surface surface of the silicon substrate.

The photovoltaic solar cells 130 are electrically connected in series or in parallel, or in both ways.

Specifically, a plurality of photovoltaic solar cells 130 are electrically connected by a ribbon 133 to an adjacent photovoltaic solar cell 130. The ribbon 133 is joined to the front-surface electrode formed a light receiving surface of the photovoltaic solar cell 130 and the rear-surface electrode formed on the rear surface of another photovoltaic solar cell 130.

In the drawings, it is illustrated that two lines of ribbons are formed, that the photovoltaic solar cells are connected in a row by the ribbon, and a photovoltaic solar cell string 140 is formed.

Accordingly, as illustrated in FIG. 12, six photovoltaic solar cell strings 140 are formed and each string comprises ten photovoltaic solar cells 130. Adjacent photovoltaic solar cell strings 140 can be connected via a connector 145.

The rear substrate 110 is a back sheet, and performs functions such as waterproofing, insulating, and ultraviolet-ray blocking. The rear substrate 110 is a type of Tedlar/PET/Tedlar (TPT), but is not limited to this. In addition, FIG. 4 illustrates that the rear substrate 110 is in the shape of a rectangle. However, the rear substrate 110 can be manufactured in various shapes, such as a circle and a semicircle, according to an environment where the photovoltaic solar cell module 100 is installed.

On the other hand, the first sealing material 120, which has the same size as the rear substrate 110, is attached to be formed on the rear substrate 110, and a plurality of photovoltaic solar cells 130 are positioned, adjacent to each other, on the first sealing material 120 in order to form several rows of photovoltaic solar cells 300.

The second sealing material 150 is positioned on the photovoltaic solar cell 130 in order to be joined to the first sealing material 120 by lamination.

At this point, the first sealing material 120 and the second sealing material 150 play a role of chemically combining elements of each photovoltaic solar cell with each other. Various examples of the first sealing material 120 and the second sealing material 150 comprise an Ethylene Vinyl Acetate (EVA) film.

On the other hand, the front substrate 160 is positioned on the second sealing material 150 in order for sunlight to pass through. It is preferable that the front substrate 160 is tempered glass in order to protect the photovoltaic solar cell against physical shock from the outside and the like. In addition, it is more preferable that the front substrate 160 is made of less-iron tempered glass that contains less iron in order to prevent sunlight reflection and increase a transmittance.

As is apparent from the above description, a photovoltaic module according to an embodiment of the present invention comprises a photovoltaic solar cell, a converter to convert a level of a direct current power from the photovoltaic solar cell, an inverter to convert the direct current power from the converter into an alternating current power, a controller to control the converter and the inverter, and a communication unit to perform electric power line communication with a gateway and at least one nearby photovoltaic module. In the photovoltaic module, the communication unit periodically transmits communication state information to the gateway and the at least one nearby photovoltaic module using the electric power line communication, and receives a message transmitted by the gateway along a path determined according to the communication state information. Thereby, optimal message reception or transmission can be possible according to an electric power line communication environment.

For example, in a case where the electric power line communication between the gateway and a first photovoltaic module is temporarily impossible, direct communication between the gateway and the first photovoltaic module may not be performed, and instead, message transmission between the photovoltaic module and the gateway and message transmission between the photovoltaic module and the first photovoltaic module can be performed in a manner that takes a detour. Thus, stable message transmission can be possible.

Particularly, with an attempt being made for message transmission between the gateway and the first photovoltaic module, the optimal message reception or transmission can be possible according to the electric power line communication environment based on information of a routing tree generated in the gateway.

According to another embodiment of the present invention, there is provided a photovoltaic module comprises a photovoltaic solar cell, a converter to convert a level of a direct current power from the photovoltaic solar cell, an inverter to convert the direct current power from the converter into an alternating current power, a controller to control the converter and the inverter, and a communication unit to perform electric power line communication with a gateway and at least one nearby photovoltaic module. In the photovoltaic module, the communication unit receives a message transmitted by the gateway along a path determined according to communication state information, via a first photovoltaic module of the at least one nearby photovoltaic module. Thereby, the optimal message reception or transmission can be possible according to the electric power line communication situation.

According to another embodiment of the present invention, there is provided a photovoltaic system comprises a plurality of photovoltaic modules, and a gateway to perform electric power line communication with the plurality of photovoltaic modules. In the photovoltaic system, the gateway receives communication state information from the plurality of photovoltaic modules, generates a routing tree for the plurality of photovoltaic modules based on the communication state information, and transmits a message to a second photovoltaic module adjacent to a first photovoltaic module, based on information of the generated routing tree for transmitting the message to the first photovoltaic module among the plurality of photovoltaic modules. Thereby, the optimal message reception and the transmission can be possible according to the electric power line communication situation.

Particularly, the gateway receives communication state information that comprises self-identification information of the photovoltaic module and reception sensitivity information of a self-identification signal of at least one nearby photovoltaic module, from each of the photovoltaic modules, and based on the communication state information, generates the routing tree. Thus, the optimal message reception or transmission can be possible according to a current electric power line communication environment.

The gateway periodically updates the routing tree, and thus always-optimal message reception or transmission is possible.

For example, in the case where the electric power line communication between the gateway and the first photovoltaic module is temporarily impossible, the direct communication between the gateway and the first photovoltaic module need not be performed, and instead, message transmission between a second photovoltaic module and the gateway and message transmission between the second photovoltaic module and the first photovoltaic module can be performed in a manner that takes a detour. Thus, the stable message transmission is possible.

Particularly, with an attempt being made for message transmission between the gateway and the first photovoltaic module, the optimal message reception or transmission can be possible according to the electric power line communication environment based on information of a routing tree generated in the gateway.

According to another embodiment of the present invention, there is provided a method of operating a photovoltaic system comprises a plurality of photovoltaic modules and a gateway to perform electric power line communication with the plurality of photovoltaic modules, the method comprising: receiving communication state information from the plurality of photovoltaic modules, generating a communication path that determines a first photovoltaic module group that possibly transmits a message directly to the gateway and a second photovoltaic module group that possibly transmits a message via at least one photovoltaic module in the first photovoltaic module group, based on the communication state information from the plurality of photovoltaic modules, and transmitting a message along the communication path generated in advance, when transmitting the message to one among the plurality of photovoltaic modules. Accordingly, the optimal message reception or transmission can be possible according to a current electric power line communication environment.

With regard to the photovoltaic module, the photovoltaic system, and the method of operating the photovoltaic system, the configurations and the methods according to the embodiments, as described above, are not applied in a limited manner, and one or several, or all of the embodiments can be selectively combined for configuration in order to realize various embodiments.

In addition, the desirable embodiments of the present embodiment are described above using the illustrations by the drawings, but the present invention is not limited to the specific embodiments described. It is, of course, apparent to a person of ordinary skill in the related art that various modifications are possible without departing from the gist of the present invention set forth in Claim. The various embodiments should not be individually understood from the technical idea of the present invention or aspects of the present invention.

What is claimed is:

1. A photovoltaic module comprising:
   a photovoltaic solar cell;
   a converter to convert a level of a direct current power from the photovoltaic solar cell;
   an inverter to convert the direct current power from the converter into an alternating current power;
   a controller to control the converter and the inverter; and
   a communication unit to perform electric power line communication with a gateway and at least one nearby photovoltaic module,
   wherein the communication unit periodically transmits communication state information to the gateway and the at least one nearby photovoltaic module using the electric power line communication, and receives a message transmitted by the gateway along a path determined according to the communication state information.

2. The photovoltaic module according to claim 1,
   wherein the communication state information transmitted by the communication unit comprises self-identification information of the photovoltaic module and reception sensitivity information of a self-identification signal of the at least one nearby photovoltaic module.

3. The photovoltaic module according to claim 1,
   wherein, when the communication unit receives the message to be transmitted to a first photovoltaic module of the at least one nearby photovoltaic module, from the gateway, the communication unit transmits the received message to the first photovoltaic module.

4. The photovoltaic module according to claim 2,
   wherein the reception sensitivity information comprises signal strength information of the self-identification signal of the at least one nearby photovoltaic module.

5. The photovoltaic module according to claim 1,
   wherein the communication unit periodically transmits a self-identification signal,
   wherein the communication unit receives a self-identification signal of the at least one nearby photovoltaic module, and transmits the communication state information based on the reception sensitivity information of the self-identification signal of the at least one nearby photovoltaic module, to the gateway and the at least one nearby photovoltaic module, and
   wherein the communication unit receives the message from the gateway along the path determined based on information on a routing tree for a plurality of photovoltaic modules, which is generated in the gateway based on the communication state information, and transmits the received massage to a first photovoltaic module of the at least one nearby photovoltaic module.

6. The photovoltaic module according to claim 1,
   wherein, when there is a need to transmit a message from the gateway to a first photovoltaic module of the at least one nearby photovoltaic module, without direct transmission between the gateway and the first photovoltaic module, the communication unit receives the message from the gateway and transmits the received message to the first photovoltaic module, according to information on a routing tree for a plurality of photovoltaic modules.

7. The photovoltaic module according to claim 1,
   wherein the communication unit receives information of a routing tree from the gateway, and
   wherein, based on the information on the routing tree, the controller is configured to transmit the message received from the gateway to a first photovoltaic module of the at least one nearby photovoltaic module corresponding to a leaf photovoltaic module.

8. The photovoltaic module according to claim 1,
   wherein, after the communication state information is transmitted, the communication unit transmits electric power information generated in the photovoltaic module, to the gateway.

9. The photovoltaic module according to claim 3,
   wherein the communication unit receives a response message that corresponds to the message, from the first photovoltaic module, and transmits the response message to the gateway.

10. The photovoltaic module according to claim 1,
    wherein the communication unit receives the message transmitted from the gateway along the path determined according to the communication state information, from a first photovoltaic module of the at least one nearby photovoltaic module.

11. The photovoltaic module according to claim 10,
    wherein, when the gateway needs to transmit a message to the photovoltaic module, without direct transmission from the gateway, the communication unit receives the message from the first photovoltaic module according to information on a routing tree for a plurality of photovoltaic modules.

12. The photovoltaic module according to claim 10,
    wherein the communication unit receives information on a routing tree generated in the gateway, from the first photovoltaic module, and
    wherein, based on the information on the routing tree, the controller performs control in such a manner that a response message which corresponds to the message is transmitted to the first photovoltaic module that corresponds to a branch photovoltaic module.

13. The photovoltaic module according to claim 10,
    wherein, after the communication state information is transmitted, the communication unit transmits electric power information generated in the photovoltaic module, to the first photovoltaic module.

* * * * *